(12) United States Patent
Daraeizadeh et al.

(10) Patent No.: US 11,526,793 B2
(45) Date of Patent: Dec. 13, 2022

(54) QUANTUM STATE IMAGING FOR MEMORY OPTIMIZATION

(71) Applicant: INTEL CORPORATION, Santa Clara, CA (US)

(72) Inventors: Sahar Daraeizadeh, Beaverton, OR (US); Anne Matsuura, Portland, OR (US); Justin Hogaboam, Aloha, OR (US)

(73) Assignee: INTEL CORPORATION, Santa Clara, CA (US)

( * ) Notice: Subject to any disclaimer, the term of this patent is extended or adjusted under 35 U.S.C. 154(b) by 923 days.

(21) Appl. No.: 16/152,311

(22) Filed: Oct. 4, 2018

(65) Prior Publication Data

US 2019/0042974 A1    Feb. 7, 2019

(51) Int. Cl.
| | |
|---|---|
| *G06N 10/00* | (2022.01) |
| *G06T 15/00* | (2011.01) |
| *G06N 7/00* | (2006.01) |
| *G06F 30/3308* | (2020.01) |

(52) U.S. Cl.
CPC ......... *G06N 10/00* (2019.01); *G06F 30/3308* (2020.01); *G06N 7/005* (2013.01); *G06T 15/00* (2013.01); *G06T 15/005* (2013.01)

(58) Field of Classification Search
CPC ..... G06F 30/3308; G06F 15/76; G06N 10/00; G06T 15/005
See application file for complete search history.

(56) References Cited

U.S. PATENT DOCUMENTS

| | | | |
|---|---|---|---|
| 7,930,152 B2* | 4/2011 | Coffey | G06T 5/00 |
| | | | 706/14 |
| 9,053,216 B1* | 6/2015 | Coleman | G06F 11/079 |
| 9,323,638 B2* | 4/2016 | Coleman | G06F 11/1484 |
| 9,836,347 B2* | 12/2017 | McChord | G06F 11/301 |
| 9,858,531 B1* | 1/2018 | Monroe | G06F 15/76 |
| 10,705,939 B2* | 7/2020 | McChord | G06F 11/3024 |
| 2015/0234728 A1* | 8/2015 | Coleman | G06F 11/3024 |
| | | | 714/57 |

(Continued)

FOREIGN PATENT DOCUMENTS

JP    4585742 B2 *    11/2010

OTHER PUBLICATIONS

Biamonte et al., "Quantum Tensor Networks in a Nutshell", arXiv:1708.00006v1, Jul. 31, 2017, pp. 1-34.

(Continued)

*Primary Examiner* — Thai Q Phan
(74) *Attorney, Agent, or Firm* — Nicholson De Vos Webster & Elliott LLP

(57) ABSTRACT

Apparatus and method for a full quantum state simulation. A quantum state simulation system may include a simulation configurator to map quantum register state data of a quantum processor at a first time to a representational data structure and generate a first quantum state image based on the representational data structure. The quantum state simulation system may also include a quantum state simulator to simulate the quantum register state data at a second time using the quantum register state data in the first quantum state image to update a second quantum state image, and store the first and second quantum state images to a data store.

17 Claims, 26 Drawing Sheets

(56) References Cited

U.S. PATENT DOCUMENTS

| | | | | |
|---|---|---|---|---|
| 2016/0119555 | A1* | 4/2016 | Saylor | G06V 40/19 348/78 |
| 2016/0328253 | A1* | 11/2016 | Majumdar | G06N 10/00 |
| 2016/0350169 | A1* | 12/2016 | McChord | G06F 11/324 |
| 2018/0101425 | A1* | 4/2018 | Mcchord | G06F 11/3055 |
| 2018/0365586 | A1* | 12/2018 | Garrison | G06N 10/00 |
| 2021/0124640 | A1* | 4/2021 | Nickerson | G06N 10/00 |

OTHER PUBLICATIONS

Cichocki et al., "Low-Rank Tensor Networks for Dimensionality Reduction and Large-Scale Optimization Problems: Perspectives and Challenges Part 1", Numerical Analysis (math.NA), Sep. 11, 2017, 176 pages.

Cichocki et al., "Tensor Networks for Dimensionality Reduction and Large-Scale Optimizations Part 2 Applications and Future Perspectives", Article in Foundations and Trends® in Machine Learning, Aug. 30, 2017, 232 pages.

Fu et al., "Image Classification Using Correlation Tensor Analysis", IEEE Transactions On Image Processing, vol. 17, No. 2, Feb. 2008, pp. 226-234.

Häner et al., "0.5 Petabyte Simulation of a 45-Qubit Quantum Circuit", SC '17: Proceedings of the International Conference for High Performance Computing, Networking, Storage and Analysis, Sep. 2017, Article No. 33, pp. 1-10.

Jiang et al., "Quantum Image Scaling Up based on Nearest-Neighbor Interpolation with Integer Scaling Ratio", Quantum Information Processing, vol. 14, No. 11, 2015, pp. 4001-4026.

Lugiato et al., "Quantum imaging", Journal of Optics B: Quantum and Semiclassical Optics, vol. 4, 2002, pp. S176-S183.

Miller et al., "QMDD: A Decision Diagram Structure for Reversible and Quantum Circuits", ISMVL '06: Proceedings of the 36th International Symposium on Multiple-Valued Logic, May 2006, 6 pages.

Nielsen et al., "Quantum Computation and Quantum Information", Cambridge University Press, 2000, 29 pages.

Pednault et al., "Breaking the 49-Qubit Barrier in the Simulation of Quantum Circuits", arXiv: Quantum Physics, Oct. 2017, pp. 1-24.

Smelyanskiy et al., "qHiPSTER: The Quantum High Performance Software Testing Environment", Quantum Physics (quant-ph); Distributed, Parallel, and Cluster Computing (cs.DC), May 2016, pp. 1-9.

Yan et al., "Quantum image processing: A review of advances in its security technologies", International Journal of Quantum Information, vol. 15, No. 3, 2017, pp. 1730001-1-1730001-18.

Yao et al., "Quantum Image Processing and Its Application to Edge Detection: Theory and Experiment", Physical Review X 7, 2017, pp. 031041-1-031041-14.

Zulehner et al., "Advanced Simulation of Quantum Computations", IEEE Transactions on Computer-Aided Design of Integrated Circuits and Systems, Nov. 7, 2017, pp. 1-11.

\* cited by examiner

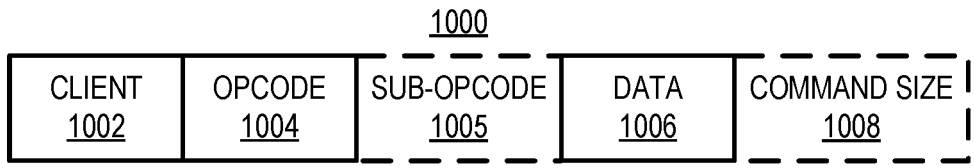
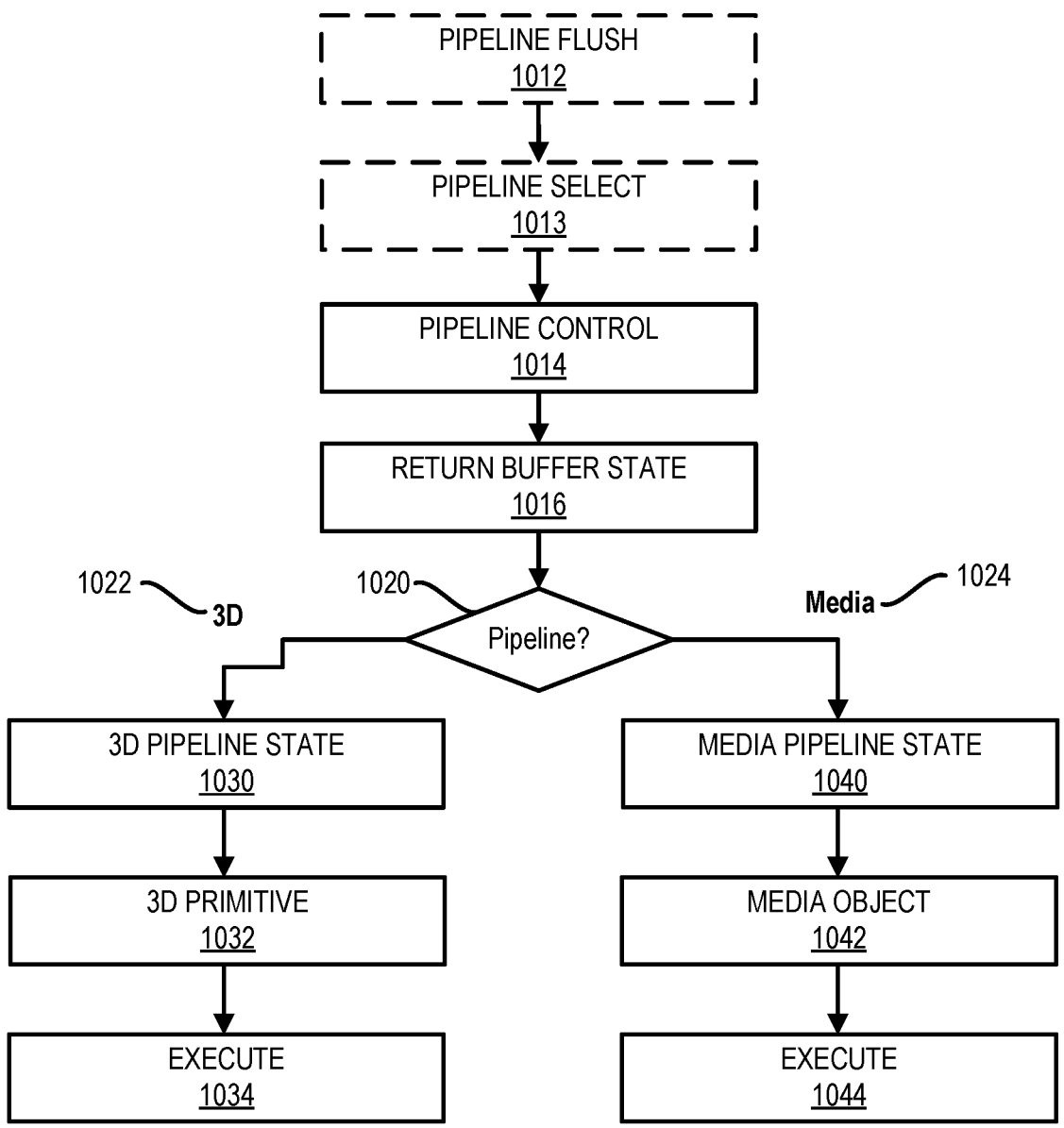

QUANTUM STATE IMAGING FOR MEMORY OPTIMIZATION

BACKGROUND

Field of the Invention

The embodiments of the invention relate generally to the field of quantum computing. More particularly, these embodiments relate to an apparatus and method for quantum state imaging for memory optimization.

Description of the Related Art

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

A better understanding of the present invention can be obtained from the following detailed description in conjunction with the following drawings, in which:

FIG. 10A is a block diagram illustrating a graphics processor command format according to some embodiments;

FIG. 10B is a block diagram illustrating a graphics processor command sequence according to an embodiment;

DETAILED DESCRIPTION

Figure 1A:
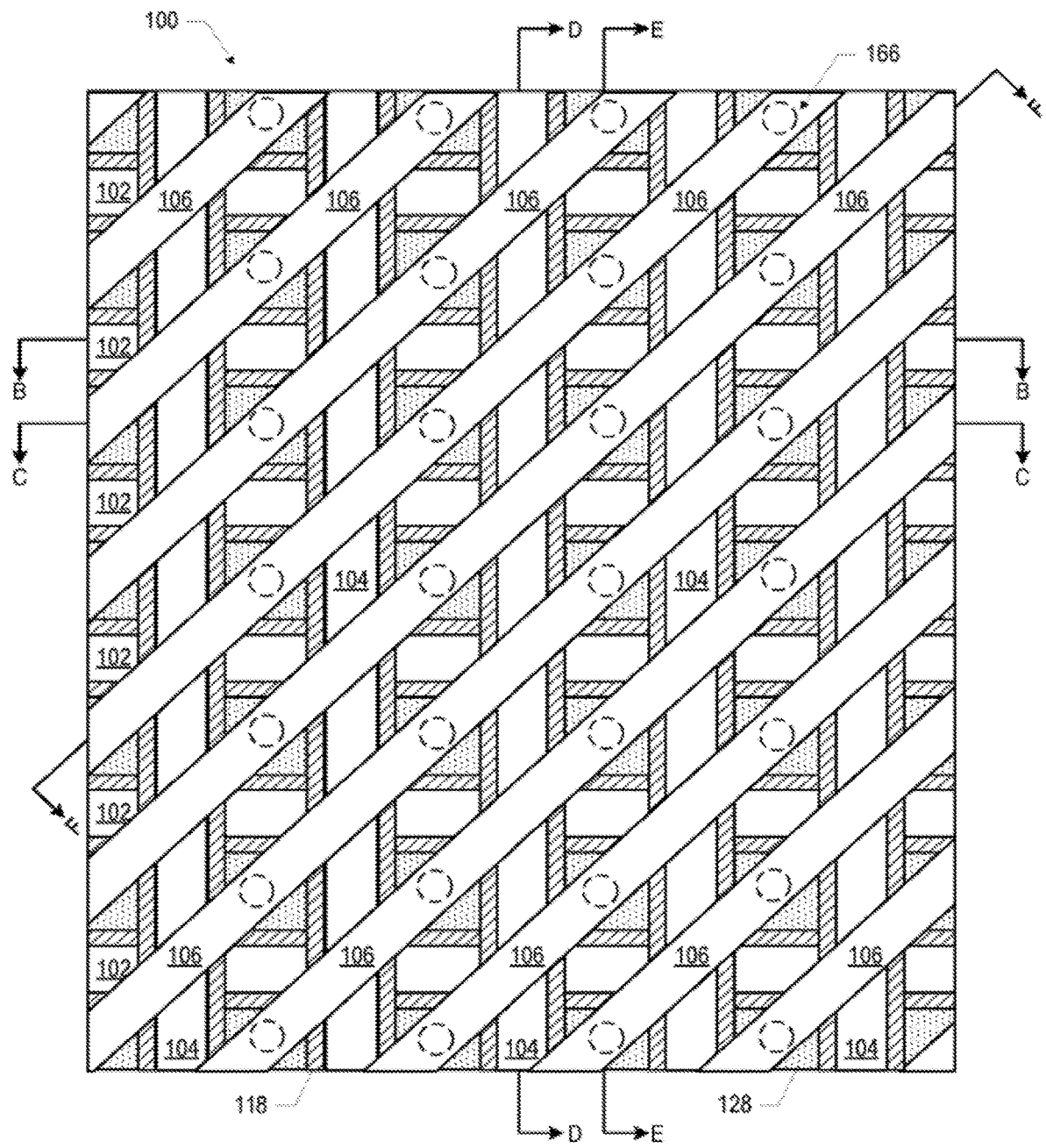
FIGS. 1A-1F illustrate various views of an example quantum dot device, in accordance with one embodiment.

In the following description, for the purposes of explanation, numerous specific details are set forth in order to provide a thorough understanding of the embodiments of the invention described below. It will be apparent, however, to one skilled in the art that the embodiments of the invention may be practiced without some of these specific details. In other instances, well-known structures and devices are shown in block diagram form to avoid obscuring the underlying principles of the embodiments of the invention.

Introduction

A quantum computer uses quantum-mechanical phenomena such as superposition and entanglement to perform computations. In contrast to digital computers which store data in one of two definite states (0 or 1), quantum computation uses quantum bits (qubits), which can be in superpositions of states. Qubits may be implemented using physically distinguishable quantum states of elementary particles such as electrons and photons. For example, the polarization of a photon may be used where the two states are vertical polarization and horizontal polarization. Similarly, the spin of an electron may have distinguishable states such as "up spin" and "down spin."

Qubit states are typically represented by the bracket notations $|0\rangle$ and $|1\rangle$. In a traditional computer system, a bit is exclusively in one state or the other, i.e., a '0' or a '1.' However, qubits in quantum mechanical systems can be in a superposition of both states at the same time, a trait that is unique and fundamental to quantum computing.

Quantum computing systems execute algorithms including quantum logic operations performed on qubits. The sequence of operations is compiled into a schedule and the qubits are addressed using an indexing scheme. This algorithm is then executed a sufficiently large number of times until the confidence interval of the computed answer is above a threshold (e.g., ~95+%). Hitting the threshold means that the desired algorithmic result has been reached.

Qubits have been implemented using a variety of different technologies which are capable of manipulating and reading quantum states. These include, but are not limited to quantum dot devices (spin based and spatial based), trapped-ion devices, superconducting quantum computers, optical lattices, nuclear magnetic resonance computers, solid-state NMR Kane quantum devices, electrons-on-helium quantum computers, cavity quantum electrodynamics (CQED) devices, molecular magnet computers, and fullerene-based ESR quantum computers, to name a few. Thus, while a quantum dot device is described below in relation to certain embodiments of the invention, the underlying principles of the invention may be employed in combination with any type of quantum computer including, but not limited to, those listed above. The particular physical implementation used for qubits is orthogonal to the embodiments of the invention described herein.

Quantum Dot Devices

Quantum dots are small semiconductor particles, typically a few nanometers in size. Because of this small size, quantum dots operate according to the rules of quantum mechanics, having optical and electronic properties which differ from macroscopic entities. Quantum dots are sometimes referred to as "artificial atoms" to connote the fact that a quantum dot is a single object with discrete, bound electronic states, as is the case with atoms or molecules.

Figure 1B:
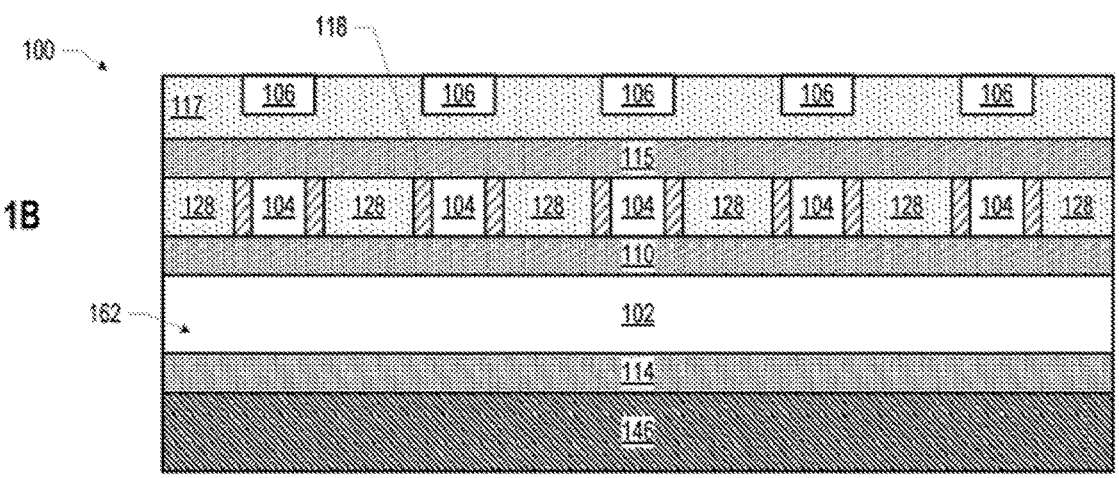
Figure 1C:
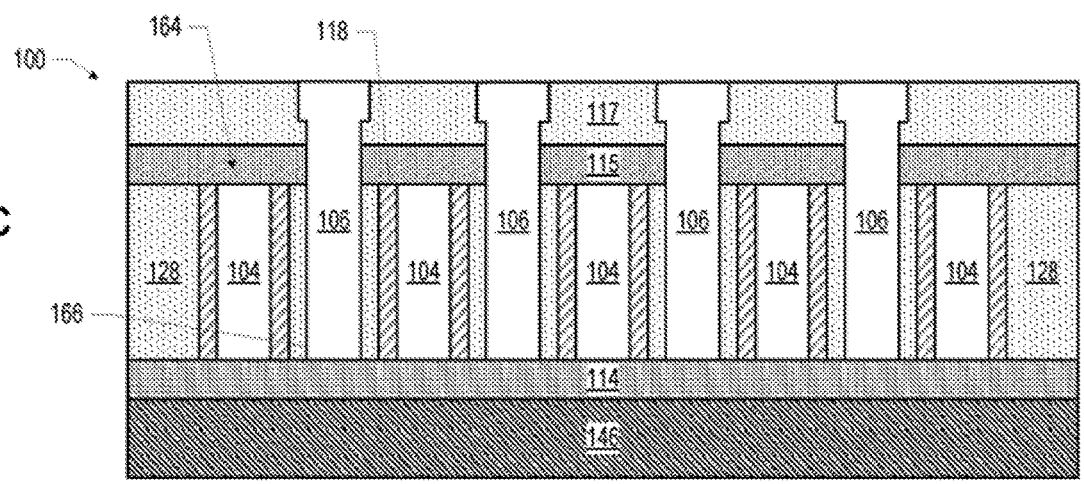
Figure 1D:
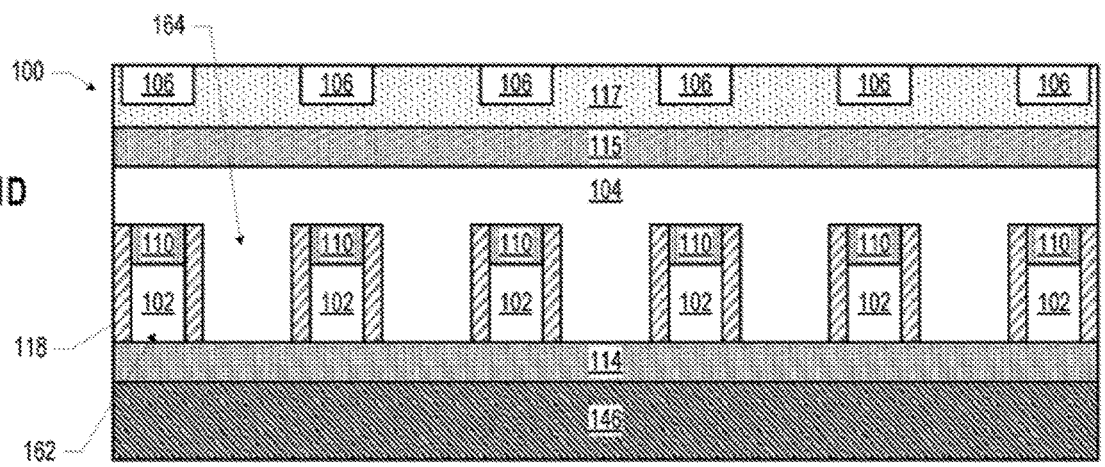
Figure 1E:
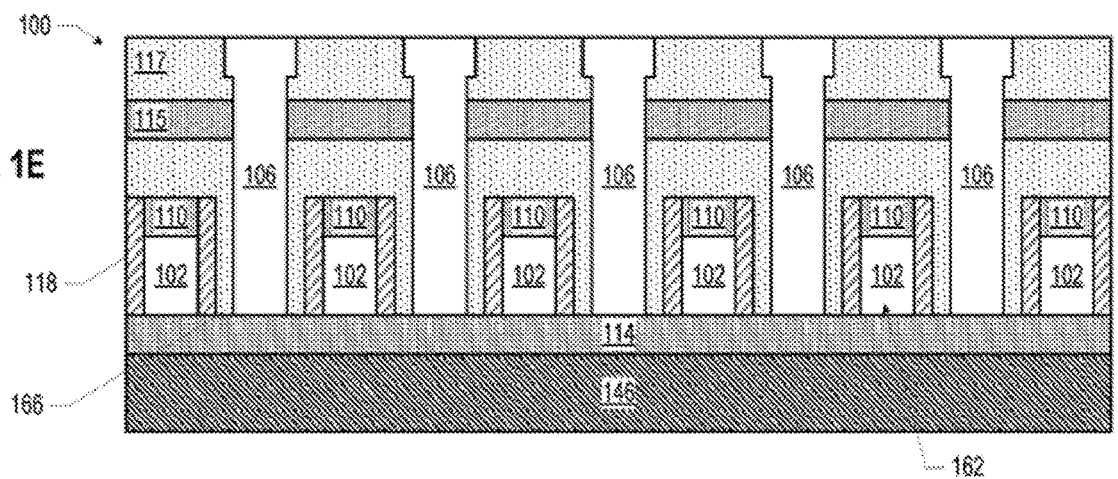
Figure 1F:
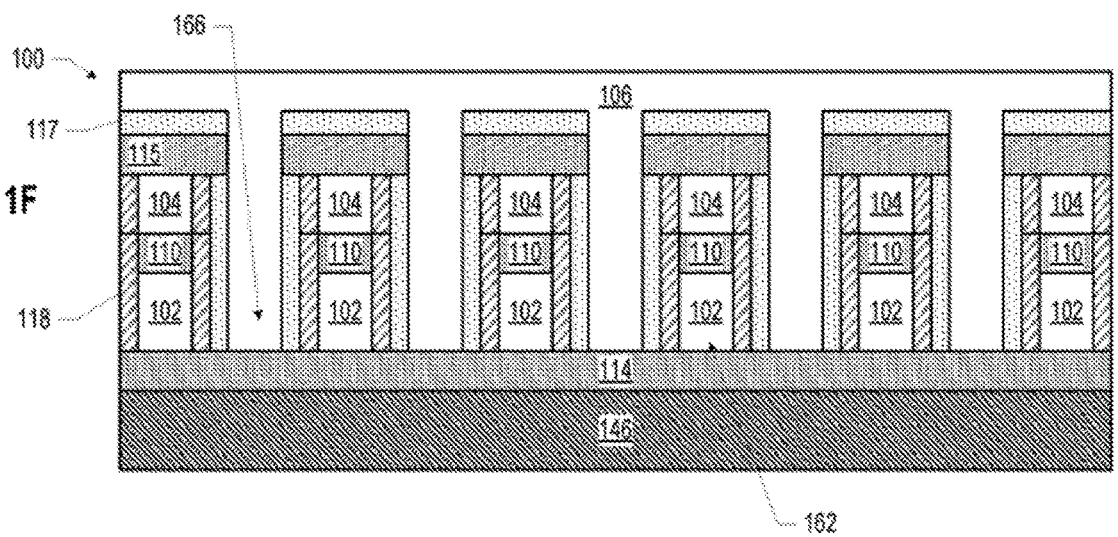

FIGS. 1A-1F are various views of a quantum dot device 100, which may be used with embodiments of the invention described below. FIG. 1A is a top view of a portion of the quantum dot device 100 with some of the materials removed so that the first gate lines 102, the second gate lines 104, and the third gate lines 106 are visible. Although many of the drawings and description herein may refer to a particular set of lines or gates as "barrier" or "quantum dot" lines or gates, respectively, this is simply for ease of discussion, and in other embodiments, the role of "barrier" and "quantum dot" lines and gates may be switched (e.g., barrier gates may instead act as quantum dot gates, and vice versa). FIGS. 1B-1F are side cross-sectional views of the quantum dot device 100 of FIG. 1A; in particular, FIG. 1B is a view through the section B-B of FIG. 1A, FIG. 1C is a view through the section C-C of FIG. 1A, FIG. 1D is a view through the section D-D of FIG. 1A, FIG. 1E is a view through the section E-E of FIG. 1A, and FIG. 1F is a view through the section F-F of FIG. 1A.

The quantum dot device 100 of FIG. 1 may be operated in any of a number of ways. For example, in some embodiments, electrical signals such as voltages, currents, radio frequency (RF), and/or microwave signals, may be provided to one or more first gate line 102, second gate line 104, and/or third gate line 106 to cause a quantum dot (e.g., an electron spin-based quantum dot or a hole spin-based quantum dot) to form in a quantum well stack 146 under a third gate 166 of a third gate line 106. Electrical signals provided to a third gate line 106 may control the electrical potential of a quantum well under the third gates 166 of that third gate line 106, while electrical signals provided to a first gate line 102 (and/or a second gate line 104) may control the potential energy barrier under the first gates 162 of that first gate line 102 (and/or the second gates 164 of that second gate line 104) between adjacent quantum wells. Quantum interactions between quantum dots in different quantum wells in the quantum well stack 146 (e.g., under different quantum dot gates) may be controlled in part by the potential energy barrier provided by the barrier potentials imposed between them (e.g., by intervening barrier gates).

Generally, the quantum dot devices 100 disclosed herein may further include a source of magnetic fields (not shown) that may be used to create an energy difference in the states of a quantum dot (e.g., the spin states of an electron spin-based quantum dot) that are normally degenerate, and the states of the quantum dots (e.g., the spin states) may be manipulated by applying electromagnetic energy to the gates lines to create quantum bits capable of computation. The source of magnetic fields may be one or more magnet lines, as discussed below. Thus, the quantum dot devices 100 disclosed herein may, through controlled application of electromagnetic energy, be able to manipulate the position, number, and quantum state (e.g., spin) of quantum dots in the quantum well stack 146.

In the quantum dot device 100 of FIG. 1, a gate dielectric 114 may be disposed on a quantum well stack 146. A quantum well stack 146 may include at least one quantum well layer 152 (not shown in FIG. 1) in which quantum dots may be localized during operation of the quantum dot device 100. The gate dielectric 114 may be any suitable material, such as a high-k material. Multiple parallel first gate lines 102 may be disposed on the gate dielectric 114, and spacer material 118 may be disposed on side faces of the first gate lines 102. In some embodiments, a patterned hardmask 110 may be disposed on the first gate lines 102 (with the pattern corresponding to the pattern of the first gate lines 102), and the spacer material 118 may extend up the sides of the hardmask 110, as shown. The first gate lines 102 may each be a first gate 162. Different ones of the first gate lines 102 may be electrically controlled in any desired combination (e.g., each first gate line 102 may be separately electrically controlled, or some or all the first gate lines 102 may be shorted together in one or more groups, as desired).

Multiple parallel second gate lines 104 may be disposed over and between the first gate lines 102. As illustrated in FIG. 1, the second gate lines 104 may be arranged perpendicular to the first gate lines 102. The second gate lines 104 may extend over the hardmask 110, and may include second gates 164 that extend down toward the quantum well stack 146 and contact the gate dielectric 114 between adjacent ones of the first gate lines 102, as illustrated in FIG. 1D. In some embodiments, the second gates 164 may fill the area between adjacent ones of the first gate lines 102/spacer material 118 structures; in other embodiments, an insulating material (not shown) may be present between the first gate lines 102/spacer material 118 structures and the proximate second gates 164. In some embodiments, spacer material 118 may be disposed on side faces of the second gate lines 104; in other embodiments, no spacer material 118 may be disposed on side faces of the second gate lines 104. In some embodiments, a hardmask 115 may be disposed above the second gate lines 104. Multiple ones of the second gates 164 of a second gate line 104 are electrically continuous (due to the shared conductive material of the second gate line 104 over the hardmask 110). Different ones of the second gate lines 104 may be electrically controlled in any desired combination (e.g., each second gate line 104 may be separately electrically controlled, or some or all the second gate lines 104 may be shorted together in one or more groups, as desired). Together, the first gate lines 102 and the second gate lines 104 may form a grid, as depicted in FIG. 1.

Multiple parallel third gate lines 106 may be disposed over and between the first gate lines 102 and the second gate lines 104. As illustrated in FIG. 1, the third gate lines 106 may be arranged diagonal to the first gate lines 102, and diagonal to the second gate lines 104. In particular, the third gate lines 106 may be arranged diagonally over the openings in the grid formed by the first gate lines 102 and the second gate lines 104. The third gate lines 106 may include third gates 166 that extend down to the gate dielectric 114 in the openings in the grid formed by the first gate lines 102 and the second gate lines 104; thus, each third gate 166 may be bordered by two different first gate lines 102 and two different second gate lines 104. In some embodiments, the third gates 166 may be bordered by insulating material 128; in other embodiments, the third gates 166 may fill the openings in the grid (e.g., contacting the spacer material 118 disposed on side faces of the adjacent first gate lines 102 and the second gate lines 104, not shown). Additional insulating material 117 may be disposed on and/or around the third gate lines 106. Multiple ones of the third gates 166 of a third gate line 106 are electrically continuous (due to the shared conductive material of the third gate line 106 over the first gate lines 102 and the second gate lines 104). Different ones of the third gate lines 106 may be electrically controlled in any desired combination (e.g., each third gate line 106 may be separately electrically controlled, or some or all the third gate lines 106 may be shorted together in one or more groups, as desired).

Although FIGS. 1A-F illustrate a particular number of first gate lines 102, second gate lines 104, and third gate lines 106, this is simply for illustrative purposes, and any number of first gate lines 102, second gate lines 104, and third gate lines 106 may be included in a quantum dot device 100. Other examples of arrangements of first gate lines 102, second gate lines 104, and third gate lines 106 are possible. Electrical interconnects (e.g., vias and conductive lines) may contact the first gate lines 102, second gate lines 104, and third gate lines 106 in any desired manner.

Not illustrated in FIG. 1 are accumulation regions that may be electrically coupled to the quantum well layer of the quantum well stack 146 (e.g., laterally proximate to the quantum well layer). The accumulation regions may be spaced apart from the gate lines by a thin layer of an intervening dielectric material. The accumulation regions may be regions in which carriers accumulate (e.g., due to doping, or due to the presence of large electrodes that pull carriers into the quantum well layer), and may serve as reservoirs of carriers that can be selectively drawn into the areas of the quantum well layer under the third gates 166 (e.g., by controlling the voltages on the quantum dot gates, the first gates 162, and the second gates 164) to form carrier-based quantum dots (e.g., electron or hole quantum dots, including a single charge carrier, multiple charge carriers, or no charge carriers). In other embodiments, a quantum dot device 100 may not include lateral accumulation regions, but may instead include doped layers within the quantum well stack 146. These doped layers may provide the carriers to the quantum well layer. Any combination of accumulation regions (e.g., doped or non-doped) or doped layers in a quantum well stack 146 may be used in any of the embodiments of the quantum dot devices 100 disclosed herein.

Processing System Overview

Figure 2:
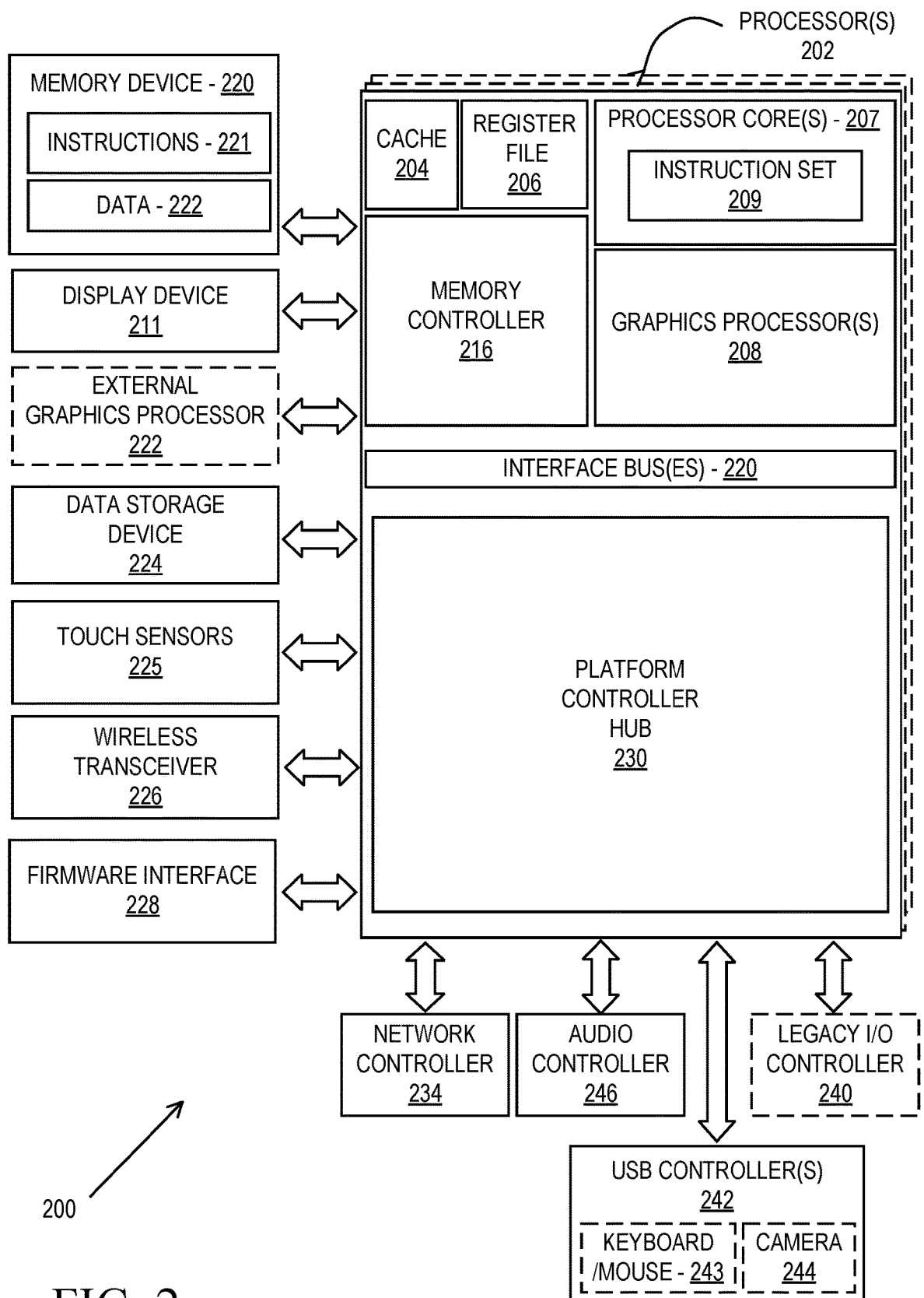
FIG. 2 is a block diagram of a processing system 200, according to an embodiment.

FIG. 2 is a block diagram of a processing system 200, according to an embodiment. In various embodiments the system 200 includes one or more processors 202 and one or more graphics processors 208, and may be a single processor desktop system, a multiprocessor workstation system, or a server system having a large number of processors 202 or processor cores 207. In one embodiment, the system 200 is a processing platform incorporated within a system-on-a-chip (SoC) integrated circuit for use in mobile, handheld, or embedded devices.

In one embodiment the system 200 can include, or be incorporated within a server-based gaming platform, a game console, including a game and media console, a mobile gaming console, a handheld game console, or an online game console. In some embodiments the system 200 is a mobile phone, smart phone, tablet computing device or mobile Internet device. The processing system 200 can also include, couple with, or be integrated within a wearable device, such as a smart watch wearable device, smart eyewear device, augmented reality device, or virtual reality device. In some embodiments, the processing system 200 is a television or set top box device having one or more processors 202 and a graphical interface generated by one or more graphics processors 208.

In some embodiments, the one or more processors 202 each include one or more processor cores 207 to process instructions which, when executed, perform operations for system and user software. In some embodiments, each of the one or more processor cores 207 is configured to process a specific instruction set 209. In some embodiments, instruction set 209 may facilitate Complex Instruction Set Computing (CISC), Reduced Instruction Set Computing (RISC), or computing via a Very Long Instruction Word (VLIW). Multiple processor cores 207 may each process a different instruction set 209, which may include instructions to facilitate the emulation of other instruction sets. Processor core 207 may also include other processing devices, such a Digital Signal Processor (DSP).

In some embodiments, the processor 202 includes cache memory 204. Depending on the architecture, the processor 202 can have a single internal cache or multiple levels of internal cache. In some embodiments, the cache memory is shared among various components of the processor 202. In some embodiments, the processor 202 also uses an external cache (e.g., a Level-3 (L3) cache or Last Level Cache (LLC)) (not shown), which may be shared among processor cores 207 using known cache coherency techniques. A register file 206 is additionally included in processor 202 which may include different types of registers for storing different types of data (e.g., integer registers, floating point registers, status registers, and an instruction pointer register). Some registers may be general-purpose registers, while other registers may be specific to the design of the processor 202.

In some embodiments, one or more processor(s) 202 are coupled with one or more interface bus(es) 210 to transmit communication signals such as address, data, or control signals between processor 202 and other components in the system 200. The interface bus 210, in one embodiment, can be a processor bus, such as a version of the Direct Media Interface (DMI) bus. However, processor busses are not limited to the DMI bus, and may include one or more Peripheral Component Interconnect buses (e.g., PCI, PCI Express), memory busses, or other types of interface busses. In one embodiment the processor(s) 202 include an integrated memory controller 216 and a platform controller hub 230. The memory controller 216 facilitates communication between a memory device and other components of the system 200, while the platform controller hub (PCH) 230 provides connections to I/O devices via a local I/O bus.

The memory device 220 can be a dynamic random access memory (DRAM) device, a static random access memory (SRAM) device, flash memory device, phase-change memory device, or some other memory device having suitable performance to serve as process memory. In one embodiment the memory device 220 can operate as system memory for the system 200, to store data 222 and instructions 221 for use when the one or more processors 202 executes an application or process. Memory controller 216 also couples with an optional external graphics processor 212, which may communicate with the one or more graphics processors 208 in processors 202 to perform graphics and media operations. In some embodiments a display device 211 can connect to the processor(s) 202. The display device 211 can be one or more of an internal display device, as in a mobile electronic device or a laptop device or an external display device attached via a display interface (e.g., DisplayPort, etc.). In one embodiment the display device 211 can be a head mounted display (HMD) such as a stereoscopic display device for use in virtual reality (VR) applications or augmented reality (AR) applications.

In some embodiments the platform controller hub 230 enables peripherals to connect to memory device 220 and processor 202 via a high-speed I/O bus. The I/O peripherals include, but are not limited to, an audio controller 246, a network controller 234, a firmware interface 228, a wireless transceiver 226, touch sensors 225, a data storage device 224 (e.g., hard disk drive, flash memory, etc.). The data storage device 224 can connect via a storage interface (e.g., SATA) or via a peripheral bus, such as a Peripheral Component Interconnect bus (e.g., PCI, PCI Express). The touch sensors 225 can include touch screen sensors, pressure sensors, or fingerprint sensors. The wireless transceiver 226 can be a Wi-Fi transceiver, a Bluetooth transceiver, or a mobile network transceiver such as a 3G, 4G, or Long Term Evolution (LTE) transceiver. The firmware interface 228 enables communication with system firmware, and can be, for example, a unified extensible firmware interface (UEFI). The network controller 234 can enable a network connection to a wired network. In some embodiments, a high-performance network controller (not shown) couples with the interface bus 210. The audio controller 246, in one embodiment, is a multi-channel high definition audio controller. In one embodiment the system 200 incudes an optional legacy I/O controller 240 for coupling legacy (e.g., Personal System 2 (PS/2)) devices to the system. The platform controller hub 230 can also connect to one or more Universal Serial Bus (USB) controllers 242 connect input devices, such as keyboard and mouse 243 combinations, a camera 244, or other USB input devices.

It will be appreciated that the system 200 shown is exemplary and not limiting, as other types of data processing systems that are differently configured may also be used. For example, an instance of the memory controller 216 and platform controller hub 230 may be integrated into a discreet external graphics processor, such as the external graphics processor 212. In one embodiment the platform controller hub 230 and/or memory controller 260 may be external to the one or more processor(s) 202. For example, the system 200 can include an external memory controller 216 and platform controller hub 230, which may be configured as a memory controller hub and peripheral controller hub within a system chipset that is in communication with the processor(s) 202.

Figure 3:
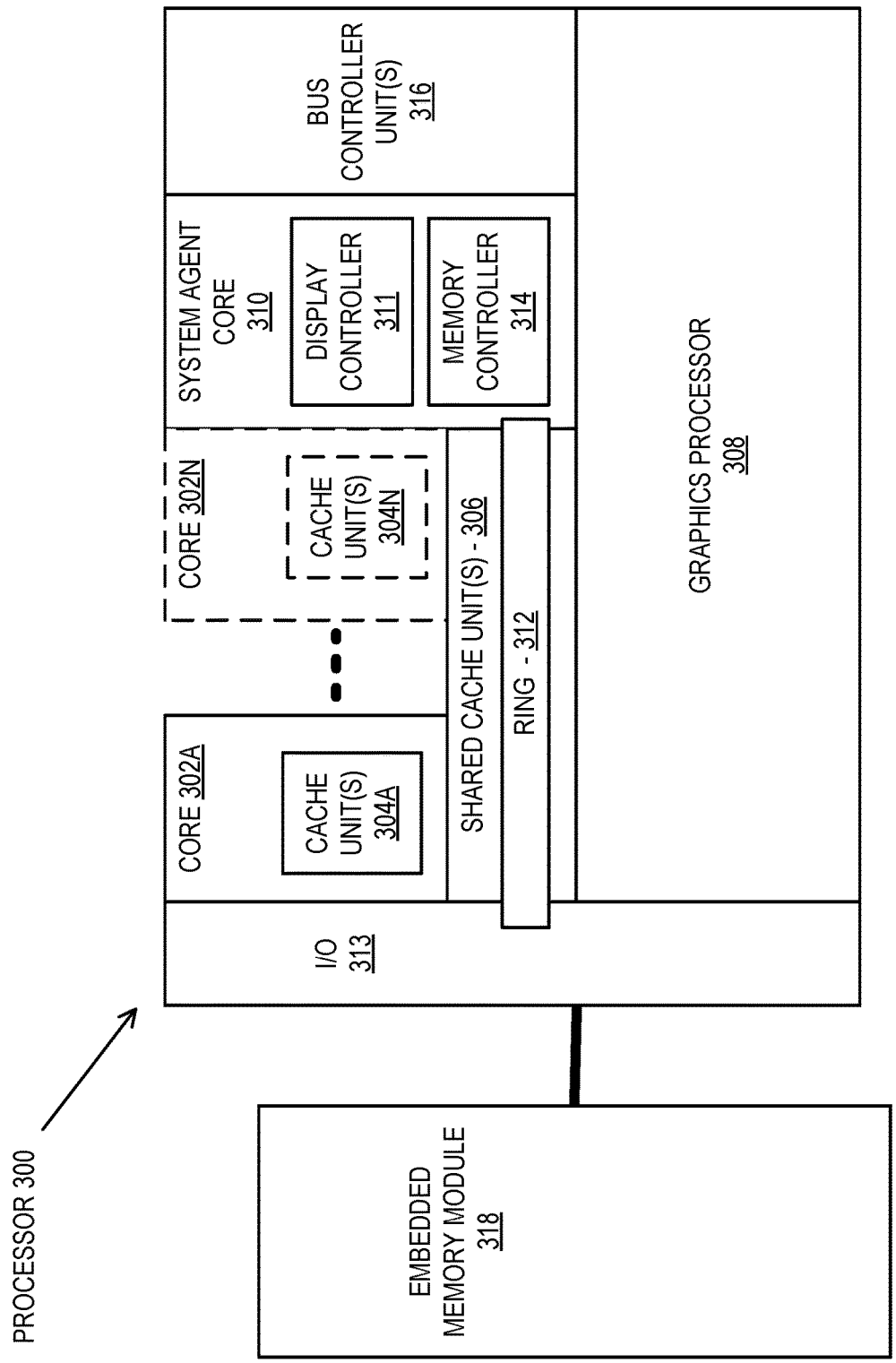
FIG. 3 is a block diagram of an embodiment of a processor.

FIG. 3 is a block diagram of an embodiment of a processor 300 having one or more processor cores 302A-302N, an integrated memory controller 314, and an integrated graphics processor 308. Those elements of FIG. 3 having the same reference numbers (or names) as the elements of any other figure herein can operate or function in any manner similar to that described elsewhere herein, but are not limited to such. Processor 300 can include additional cores up to and including additional core 302N represented by the dashed lined boxes. Each of processor cores 302A-302N includes one or more internal cache units 304A-304N. In some embodiments each processor core also has access to one or more shared cached units 306.

The internal cache units 304A-304N and shared cache units 306 represent a cache memory hierarchy within the processor 300. The cache memory hierarchy may include at least one level of instruction and data cache within each processor core and one or more levels of shared mid-level cache, such as a Level 3 (L2), Level 3 (L3), Level 4 (L4), or other levels of cache, where the highest level of cache before external memory is classified as the LLC. In some embodiments, cache coherency logic maintains coherency between the various cache units 306 and 304A-304N.

In some embodiments, processor 300 may also include a set of one or more bus controller units 316 and a system agent core 310. The one or more bus controller units 316 manage a set of peripheral buses, such as one or more PCI or PCI express busses. System agent core 310 provides management functionality for the various processor components. In some embodiments, system agent core 310 includes one or more integrated memory controllers 314 to manage access to various external memory devices (not shown).

In some embodiments, one or more of the processor cores 302A-302N include support for simultaneous multi-threading. In such embodiment, the system agent core 310 includes components for coordinating and operating cores 302A-302N during multi-threaded processing. System agent core 310 may additionally include a power control unit (PCU), which includes logic and components to regulate the power state of processor cores 302A-302N and graphics processor 308.

In some embodiments, processor 300 additionally includes graphics processor 308 to execute graphics processing operations. In some embodiments, the graphics processor 308 couples with the set of shared cache units 306, and the system agent core 310, including the one or more integrated memory controllers 314. In some embodiments, the system agent core 310 also includes a display controller 311 to drive graphics processor output to one or more coupled displays. In some embodiments, display controller 311 may also be a separate module coupled with the graphics processor via at least one interconnect, or may be integrated within the graphics processor 308.

In some embodiments, a ring based interconnect unit 312 is used to couple the internal components of the processor 300. However, an alternative interconnect unit may be used, such as a point-to-point interconnect, a switched interconnect, or other techniques, including techniques well known in the art. In some embodiments, graphics processor 308 couples with the ring interconnect 312 via an I/O link 313.

The exemplary I/O link 313 represents at least one of multiple varieties of I/O interconnects, including an on package I/O interconnect which facilitates communication between various processor components and a high-performance embedded memory module 318, such as an eDRAM module. In some embodiments, each of the processor cores 302A-302N and graphics processor 308 use embedded memory modules 318 as a shared Last Level Cache.

In some embodiments, processor cores 302A-302N are homogenous cores executing the same instruction set architecture. In another embodiment, processor cores 302A-302N are heterogeneous in terms of instruction set architecture (ISA), where one or more of processor cores 302A-302N execute a first instruction set, while at least one of the other cores executes a subset of the first instruction set or a different instruction set. In one embodiment processor cores 302A-302N are heterogeneous in terms of microarchitecture, where one or more cores having a relatively higher power consumption couple with one or more power cores having a lower power consumption. Additionally, processor 300 can be implemented on one or more chips or as an SoC integrated circuit having the illustrated components, in addition to other components.

Figure 4:
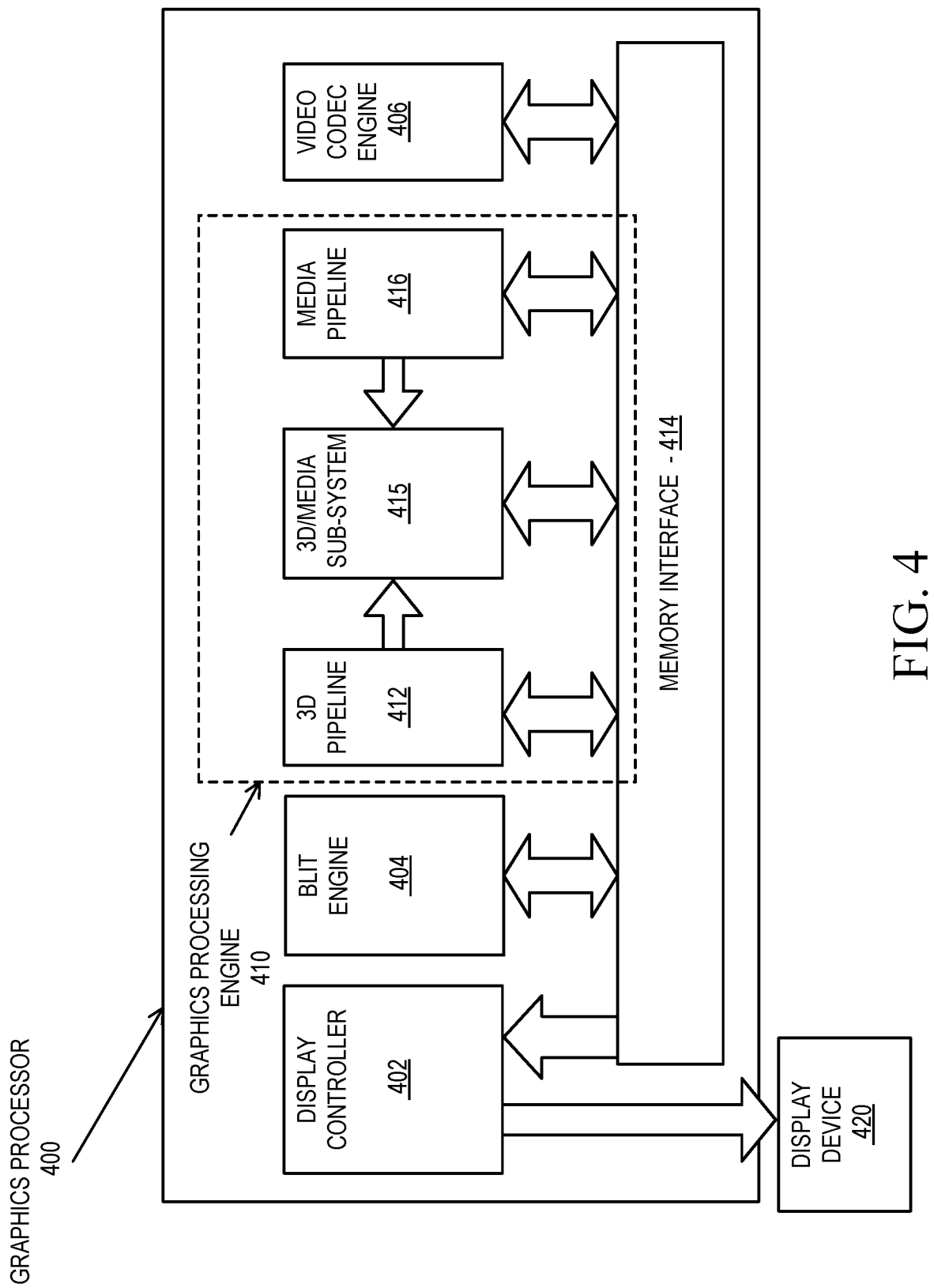
FIG. 4 is a block diagram of a graphics processor.

FIG. 4 is a block diagram of a graphics processor 400, which may be a discrete graphics processing unit, or may be a graphics processor integrated with a plurality of processing cores. In some embodiments, the graphics processor communicates via a memory mapped I/O interface to registers on the graphics processor and with commands placed into the processor memory. In some embodiments, graphics processor 400 includes a memory interface 414 to access memory. Memory interface 414 can be an interface to local memory, one or more internal caches, one or more shared external caches, and/or to system memory.

In some embodiments, graphics processor 400 also includes a display controller 402 to drive display output data to a display device 420. Display controller 402 includes hardware for one or more overlay planes for the display and composition of multiple layers of video or user interface elements. The display device 420 can be an internal or external display device. In one embodiment the display device 420 is a head mounted display device, such as a virtual reality (VR) display device or an augmented reality (AR) display device. In some embodiments, graphics processor 400 includes a video codec engine 406 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, as well as the Society of Motion Picture & Television Engineers (SMPTE) 421M/VC-1, and Joint Photographic Experts Group (JPEG) formats such as JPEG, and Motion JPEG (MJPEG) formats.

In some embodiments, graphics processor 400 includes a block image transfer (BLIT) engine 404 to perform two-dimensional (2D) rasterizer operations including, for example, bit-boundary block transfers. However, in one embodiment, 2D graphics operations are performed using one or more components of graphics processing engine (GPE) 410. In some embodiments, GPE 410 is a compute engine for performing graphics operations, including three-dimensional (3D) graphics operations and media operations.

In some embodiments, GPE 410 includes a 3D pipeline 412 for performing 3D operations, such as rendering three-dimensional images and scenes using processing functions that act upon 3D primitive shapes (e.g., rectangle, triangle, etc.). The 3D pipeline 412 includes programmable and fixed function elements that perform various tasks within the element and/or spawn execution threads to a 3D/Media sub-system 415. While 3D pipeline 412 can be used to perform media operations, an embodiment of GPE 410 also includes a media pipeline 416 that is specifically used to perform media operations, such as video post-processing and image enhancement.

In some embodiments, media pipeline 416 includes fixed function or programmable logic units to perform one or more specialized media operations, such as video decode acceleration, video de-interlacing, and video encode acceleration in place of, or on behalf of video codec engine 406. In some embodiments, media pipeline 416 additionally includes a thread spawning unit to spawn threads for execution on 3D/Media sub-system 415. The spawned threads perform computations for the media operations on one or more graphics execution units included in 3D/Media subsystem 415.

In some embodiments, 3D/Media subsystem 415 includes logic for executing threads spawned by 3D pipeline 412 and media pipeline 416. In one embodiment, the pipelines send thread execution requests to 3D/Media subsystem 415, which includes thread dispatch logic for arbitrating and dispatching the various requests to available thread execution resources. The execution resources include an array of graphics execution units to process the 3D and media threads. In some embodiments, 3D/Media subsystem 415 includes one or more internal caches for thread instructions and data. In some embodiments, the subsystem also includes shared memory, including registers and addressable memory, to share data between threads and to store output data.

Graphics Processing Engine

Figure 5:
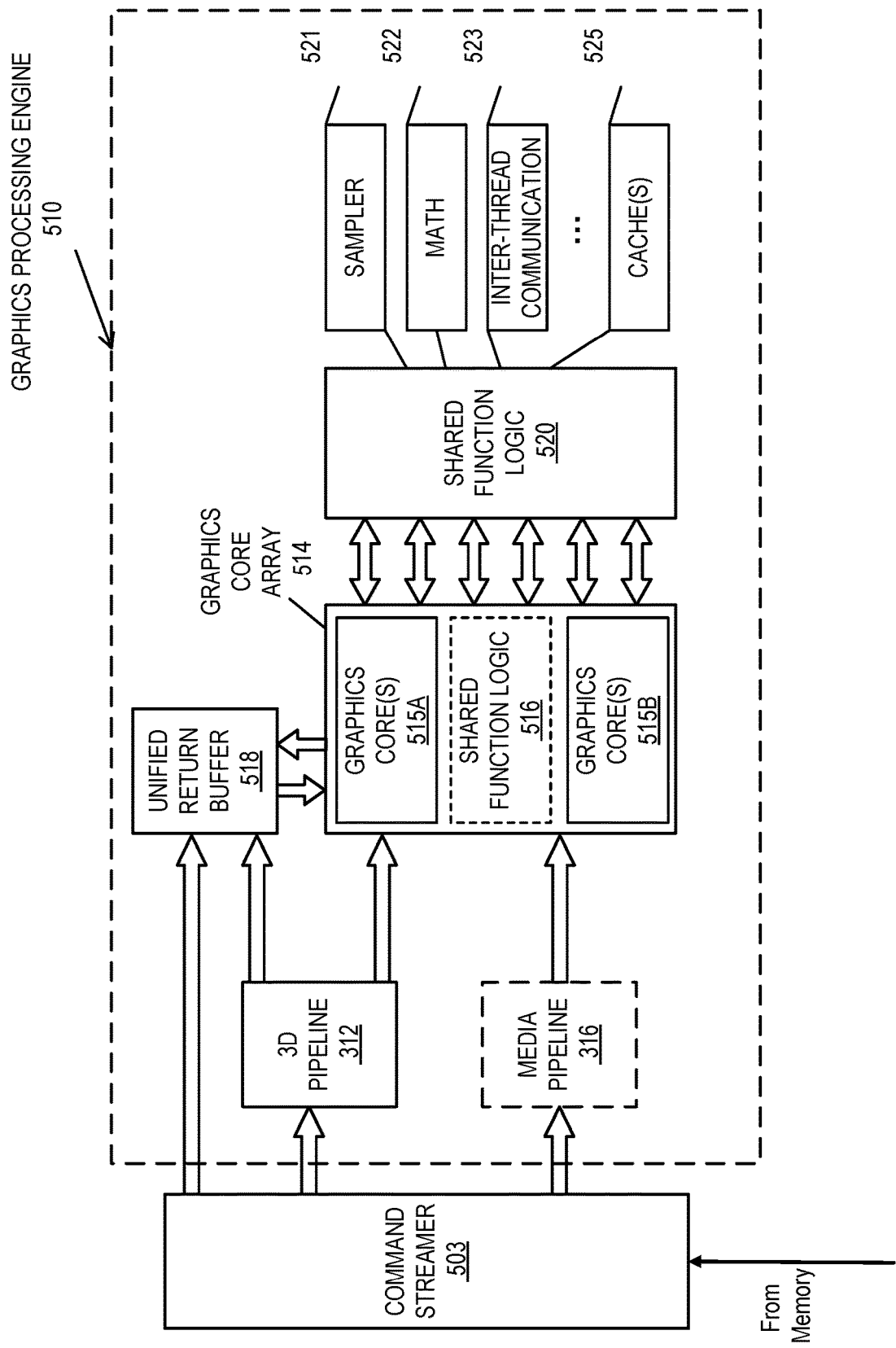
FIG. 5 is a block diagram of a graphics processing engine of a graphics processor in accordance with some embodiments.

FIG. 5 is a block diagram of a graphics processing engine 510 of a graphics processor in accordance with some embodiments. In one embodiment, the graphics processing engine (GPE) 510 is a version of the GPE 410 shown in FIG. 4. Elements of FIG. 5 having the same reference numbers (or names) as the elements of any other figure herein can operate or function in any manner similar to that described elsewhere herein, but are not limited to such. For example, the 3D pipeline 412 and media pipeline 416 of FIG. 4 are illustrated. The media pipeline 416 is optional in some embodiments of the GPE 510 and may not be explicitly included within the GPE 510. For example and in at least one embodiment, a separate media and/or image processor is coupled to the GPE 510.

In some embodiments, GPE 510 couples with or includes a command streamer 503, which provides a command stream to the 3D pipeline 412 and/or media pipelines 416. In some embodiments, command streamer 503 is coupled with memory, which can be system memory, or one or more of internal cache memory and shared cache memory. In some embodiments, command streamer 503 receives commands from the memory and sends the commands to 3D pipeline 412 and/or media pipeline 416. The commands are directives fetched from a ring buffer, which stores commands for the 3D pipeline 412 and media pipeline 416. In one embodiment, the ring buffer can additionally include batch command buffers storing batches of multiple commands. The commands for the 3D pipeline 412 can also include references to data stored in memory, such as but not limited to vertex and geometry data for the 3D pipeline 412 and/or image data and memory objects for the media pipeline 416. The 3D pipeline 412 and media pipeline 416 process the commands and data by performing operations via logic within the respective pipelines or by dispatching one or more execution threads to a graphics core array 514. In one embodiment the graphics core array 514 include one or more blocks of graphics cores (e.g., graphics core(s) 515A, graphics core(s) 515B), each block including one or more graphics cores. Each graphics core includes a set of graphics execution resources that includes general-purpose and graphics specific execution logic to perform graphics and compute operations, as well as fixed function texture processing and/or machine learning and artificial intelligence acceleration logic.

In various embodiments the 3D pipeline 412 includes fixed function and programmable logic to process one or more shader programs, such as vertex shaders, geometry shaders, pixel shaders, fragment shaders, compute shaders, or other shader programs, by processing the instructions and dispatching execution threads to the graphics core array 514. The graphics core array 514 provides a unified block of execution resources for use in processing these shader programs. Multi-purpose execution logic (e.g., execution units) within the graphics core(s) 515A-414B of the graphic core array 514 includes support for various 3D API shader languages and can execute multiple simultaneous execution threads associated with multiple shaders.

In some embodiments the graphics core array 514 also includes execution logic to perform media functions, such as video and/or image processing. In one embodiment, the execution units additionally include general-purpose logic that is programmable to perform parallel general-purpose computational operations, in addition to graphics processing operations. The general-purpose logic can perform processing operations in parallel or in conjunction with general-purpose logic within the processor core(s) 207 of FIG. 2 or core 302A-202N as in FIG. 3.

Output data generated by threads executing on the graphics core array 514 can output data to memory in a unified return buffer (URB) 518. The URB 518 can store data for multiple threads. In some embodiments the URB 518 may be used to send data between different threads executing on the graphics core array 514. In some embodiments the URB 518 may additionally be used for synchronization between threads on the graphics core array and fixed function logic within the shared function logic 520.

In some embodiments, graphics core array 514 is scalable, such that the array includes a variable number of graphics cores, each having a variable number of execution units based on the target power and performance level of GPE 510. In one embodiment the execution resources are dynamically scalable, such that execution resources may be enabled or disabled as needed.

The graphics core array 514 couples with shared function logic 520 that includes multiple resources that are shared between the graphics cores in the graphics core array. The shared functions within the shared function logic 520 are hardware logic units that provide specialized supplemental functionality to the graphics core array 514. In various embodiments, shared function logic 520 includes but is not limited to sampler 521, math 522, and inter-thread communication (ITC) 523 logic. Additionally, some embodiments implement one or more cache(s) 525 within the shared function logic 520.

A shared function is implemented where the demand for a given specialized function is insufficient for inclusion within the graphics core array 514. Instead a single instantiation of that specialized function is implemented as a stand-alone entity in the shared function logic 520 and shared among the execution resources within the graphics core array 514. The precise set of functions that are shared between the graphics core array 514 and included within the graphics core array 514 varies across embodiments. In some embodiments, specific shared functions within the shared function logic 520 that are used extensively by the graphics core array 514 may be included within shared function logic 516 within the graphics core array 514. In various embodiments, the shared function logic 516 within the graphics core array 514 can include some or all logic within the shared function logic 520. In one embodiment, all logic elements within the shared function logic 520 may be duplicated within the shared function logic 516 of the graphics core array 514. In one embodiment the shared function logic 520 is excluded in favor of the shared function logic 516 within the graphics core array 514.

Figure 6:
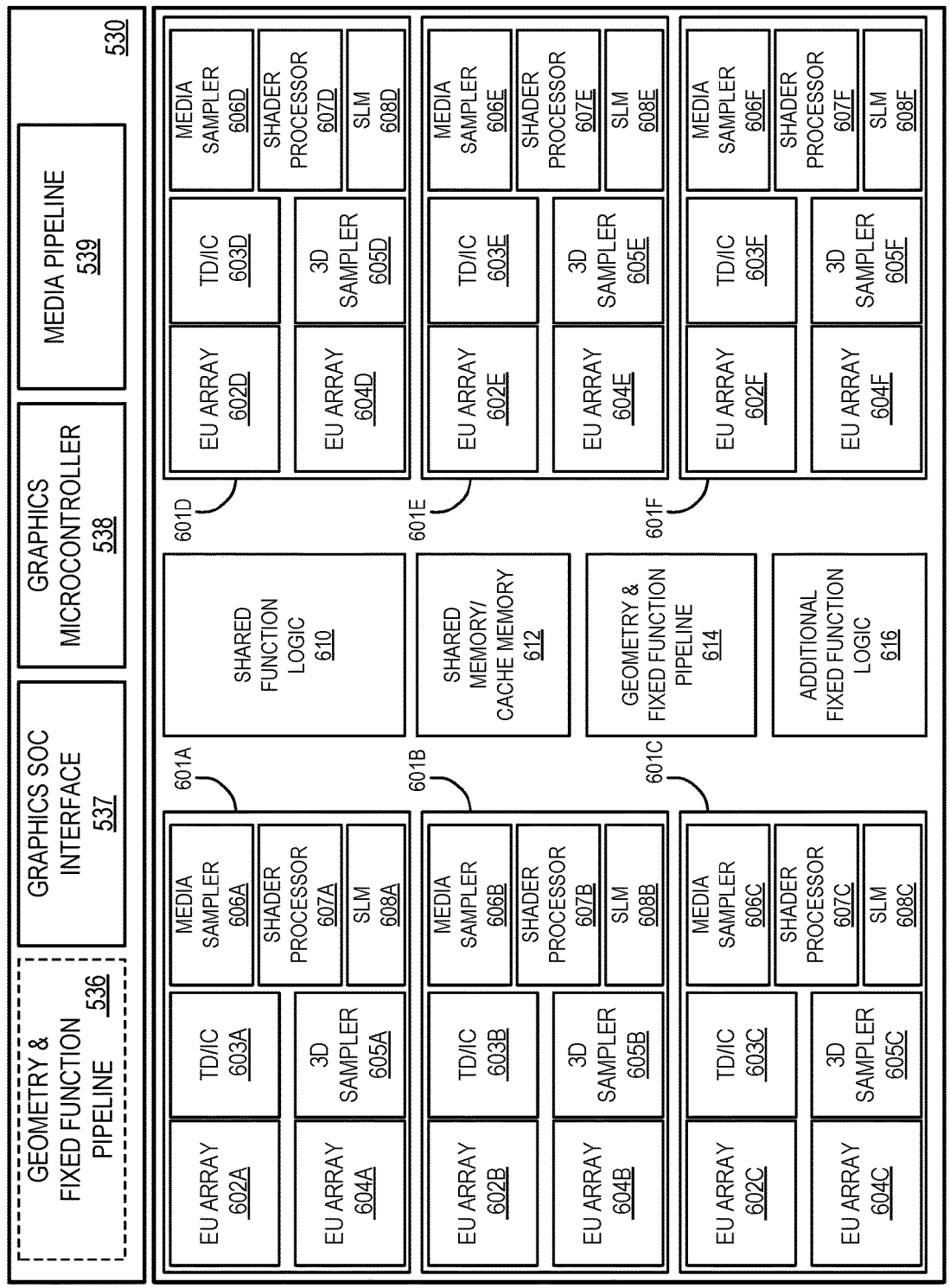
FIG. 6 is a block diagram of hardware logic of a graphics processor core, according to some embodiments described herein.

FIG. 6 is a block diagram of hardware logic of a graphics processor core 600, according to some embodiments described herein. Elements of FIG. 6 having the same reference numbers (or names) as the elements of any other figure herein can operate or function in any manner similar to that described elsewhere herein, but are not limited to such. The illustrated graphics processor core 600, in some embodiments, is included within the graphics core array 514 of FIG. 5. The graphics processor core 600, sometimes referred to as a core slice, can be one or multiple graphics cores within a modular graphics processor. The graphics processor core 600 is exemplary of one graphics core slice, and a graphics processor as described herein may include multiple graphics core slices based on target power and performance envelopes. Each graphics core 600 can include a fixed function block 630 coupled with multiple sub-cores 601A-601F, also referred to as sub-slices, that include modular blocks of general-purpose and fixed function logic.

In some embodiments the fixed function block 630 includes a geometry/fixed function pipeline 636 that can be shared by all sub-cores in the graphics processor 600, for example, in lower performance and/or lower power graphics processor implementations. In various embodiments, the geometry/fixed function pipeline 636 includes a 3D fixed function pipeline (e.g., 3D pipeline 412 as in FIG. 4 and FIG. 5) a video front-end unit, a thread spawner and thread dispatcher, and a unified return buffer manager, which manages unified return buffers, such as the unified return buffer 518 of FIG. 5.

In one embodiment the fixed function block 630 also includes a graphics SoC interface 637, a graphics microcontroller 638, and a media pipeline 639. The graphics SoC interface 637 provides an interface between the graphics core 600 and other processor cores within a system on a chip integrated circuit. The graphics microcontroller 638 is a programmable sub-processor that is configurable to manage various functions of the graphics processor 600, including thread dispatch, scheduling, and pre-emption. The media pipeline 639 (e.g., media pipeline 416 of FIG. 4 and FIG. 5) includes logic to facilitate the decoding, encoding, pre-processing, and/or post-processing of multimedia data, including image and video data. The media pipeline 639 implement media operations via requests to compute or sampling logic within the sub-cores 601-601F.

In one embodiment the SoC interface 637 enables the graphics core 600 to communicate with general-purpose application processor cores (e.g., CPUs) and/or other components within an SoC, including memory hierarchy elements such as a shared last level cache memory, the system RAM, and/or embedded on-chip or on-package DRAM. The SoC interface 637 can also enable communication with fixed function devices within the SoC, such as camera imaging pipelines, and enables the use of and/or implements global memory atomics that may be shared between the graphics core 600 and CPUs within the SoC. The SoC interface 637 can also implement power management controls for the graphics core 600 and enable an interface between a clock domain of the graphic core 600 and other clock domains within the SoC. In one embodiment the SoC interface 637 enables receipt of command buffers from a command streamer and global thread dispatcher that are configured to provide commands and instructions to each of one or more graphics cores within a graphics processor. The commands and instructions can be dispatched to the media pipeline 639, when media operations are to be performed, or a geometry and fixed function pipeline (e.g., geometry and fixed function pipeline 636, geometry and fixed function pipeline 614) when graphics processing operations are to be performed.

The graphics microcontroller 638 can be configured to perform various scheduling and management tasks for the graphics core 600. In one embodiment the graphics microcontroller 638 can perform graphics and/or compute workload scheduling on the various graphics parallel engines within execution unit (EU) arrays 602A-602F, 604A-604F within the sub-cores 601A-601F. In this scheduling model, host software executing on a CPU core of an SoC including the graphics core 600 can submit workloads one of multiple graphic processor doorbells, which invokes a scheduling operation on the appropriate graphics engine. Scheduling operations include determining which workload to run next, submitting a workload to a command streamer, pre-empting existing workloads running on an engine, monitoring progress of a workload, and notifying host software when a workload is complete. In one embodiment the graphics microcontroller 638 can also facilitate low-power or idle states for the graphics core 600, providing the graphics core 600 with the ability to save and restore registers within the graphics core 600 across low-power state transitions independently from the operating system and/or graphics driver software on the system.

The graphics core 600 may have greater than or fewer than the illustrated sub-cores 601A-601F, up to N modular sub-cores. For each set of N sub-cores, the graphics core 600 can also include shared function logic 610, shared and/or cache memory 612, a geometry/fixed function pipeline 614, as well as additional fixed function logic 616 to accelerate various graphics and compute processing operations. The shared function logic 610 can include logic units associated with the shared function logic 520 of FIG. 5 (e.g., sampler, math, and/or inter-thread communication logic) that can be shared by each N sub-cores within the graphics core 600. The shared and/or cache memory 612 can be a last-level cache for the set of N sub-cores 601A-601F within the graphics core 600, and can also serve as shared memory that is accessible by multiple sub-cores. The geometry/fixed function pipeline 614 can be included instead of the geometry/fixed function pipeline 636 within the fixed function block 630 and can include the same or similar logic units.

In one embodiment the graphics core 600 includes additional fixed function logic 616 that can include various fixed function acceleration logic for use by the graphics core 600. In one embodiment the additional fixed function logic 616 includes an additional geometry pipeline for use in position only shading. In position-only shading, two geometry pipelines exist, the full geometry pipeline within the geometry/fixed function pipeline 616, 636, and a cull pipeline, which is an additional geometry pipeline which may be included within the additional fixed function logic 616. In one embodiment the cull pipeline is a trimmed down version of the full geometry pipeline. The full pipeline and the cull pipeline can execute different instances of the same application, each instance having a separate context. Position only shading can hide long cull runs of discarded triangles, enabling shading to be completed earlier in some instances. For example and in one embodiment the cull pipeline logic within the additional fixed function logic 616 can execute position shaders in parallel with the main application and generally generates critical results faster than the full pipeline, as the cull pipeline fetches and shades only the position attribute of the vertices, without performing rasterization and rendering of the pixels to the frame buffer. The cull pipeline can use the generated critical results to compute visibility information for all the triangles without regard to whether those triangles are culled. The full pipeline (which in this instance may be referred to as a replay pipeline) can consume the visibility information to skip the culled triangles to shade only the visible triangles that are finally passed to the rasterization phase.

In one embodiment the additional fixed function logic 616 can also include machine-learning acceleration logic, such as fixed function matrix multiplication logic, for implementations including optimizations for machine learning training or inferencing.

Within each graphics sub-core 601A-601F includes a set of execution resources that may be used to perform graphics, media, and compute operations in response to requests by graphics pipeline, media pipeline, or shader programs. The graphics sub-cores 601A-601F include multiple EU arrays 602A-602F, 604A-604F, thread dispatch and inter-thread communication (TD/IC) logic 603A-603F, a 3D (e.g., texture) sampler 605A-605F, a media sampler 606A-606F, a shader processor 607A-607F, and shared local memory (SLM) 608A-608F. The EU arrays 602A-602F, 604A-604F each include multiple execution units, which are general-purpose graphics processing units capable of performing floating-point and integer/fixed-point logic operations in service of a graphics, media, or compute operation, including graphics, media, or compute shader programs. The TD/IC logic 603A-603F performs local thread dispatch and thread control operations for the execution units within a sub-core and facilitate communication between threads executing on the execution units of the sub-core. The 3D sampler 605A-605F can read texture or other 3D graphics related data into memory. The 3D sampler can read texture data differently based on a configured sample state and the texture format associated with a given texture. The media sampler 606A-606F can perform similar read operations based on the type and format associated with media data. In one embodiment, each graphics sub-core 601A-601F can alternately include a unified 3D and media sampler. Threads executing on the execution units within each of the sub-cores 601A-601F can make use of shared local memory 608A-608F within each sub-core, to enable threads executing within a thread group to execute using a common pool of on-chip memory.

Execution Units

Figure 7A:
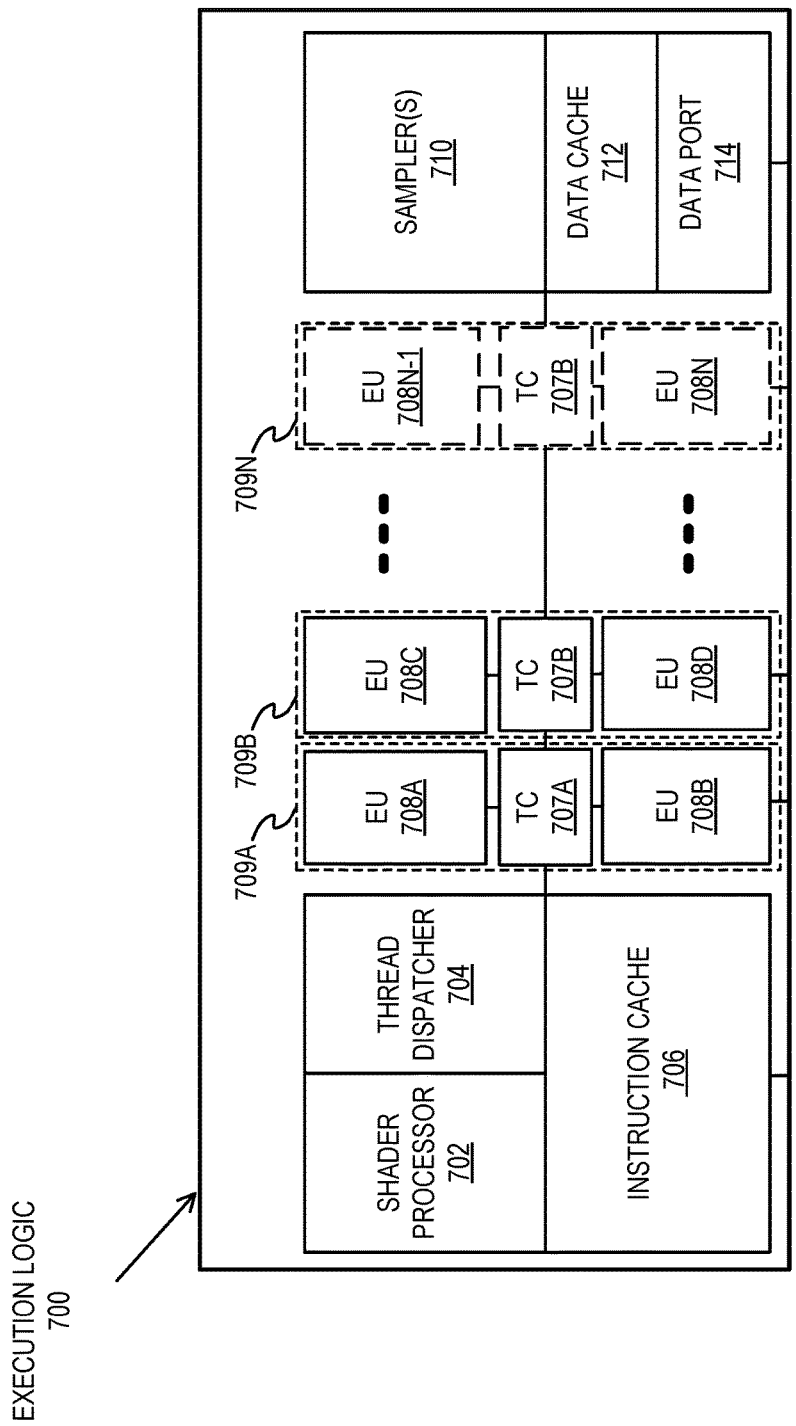
FIGS. 7A-7B illustrate thread execution logic including an array of processing elements employed in a graphics processor core according to embodiments described herein.
Figure 7B:
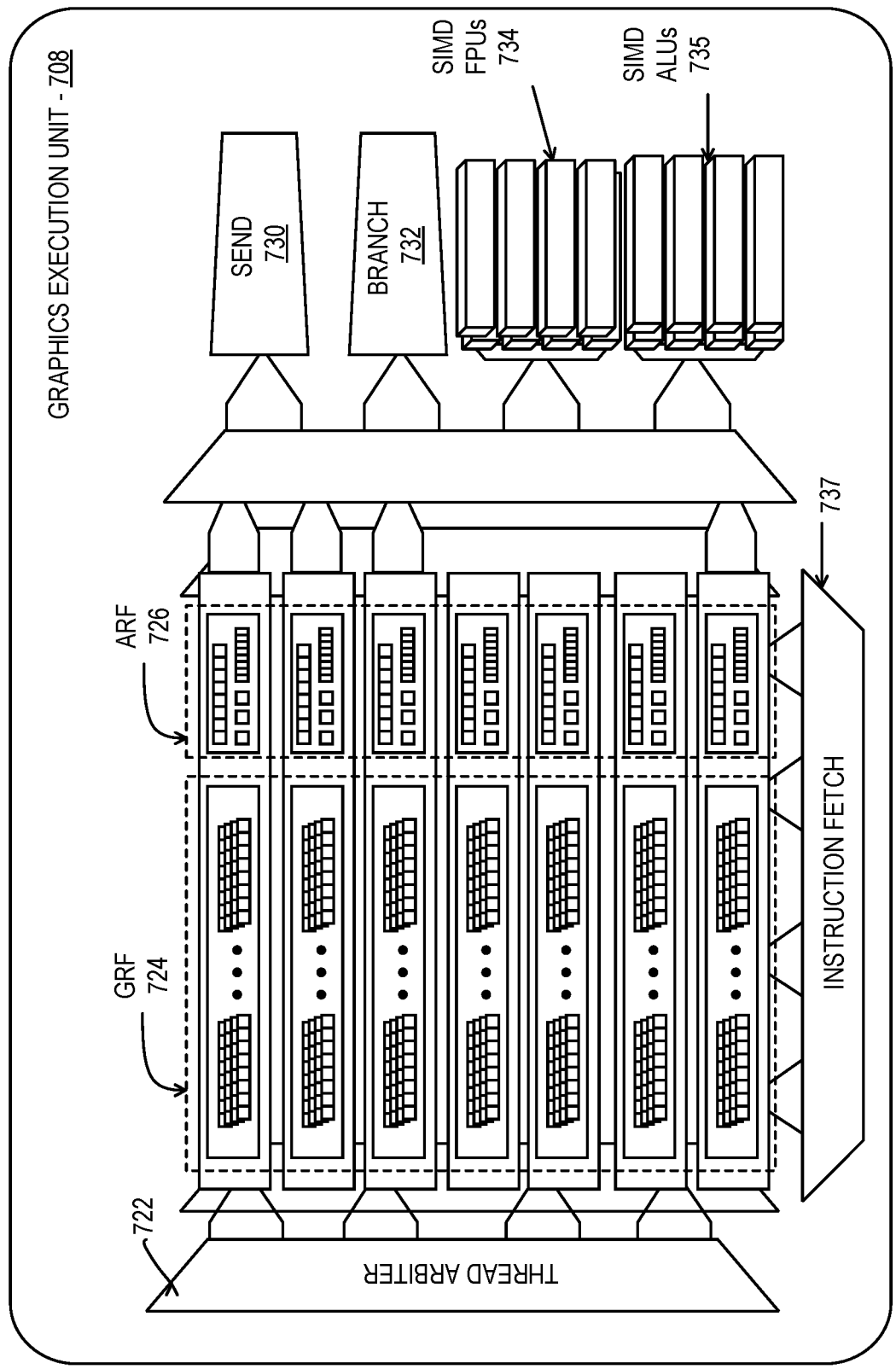

FIGS. 7A-7B illustrate thread execution logic 700 including an array of processing elements employed in a graphics processor core according to embodiments described herein. Elements of FIGS. 7A-7B having the same reference numbers (or names) as the elements of any other figure herein can operate or function in any manner similar to that described elsewhere herein, but are not limited to such. FIG. 7A illustrates an overview of thread execution logic 700, which can include a variant of the hardware logic illustrated with each sub-core 601A-501F of FIG. 6. FIG. 7B illustrates exemplary internal details of an execution unit.

As illustrated in FIG. 7A, in some embodiments thread execution logic 700 includes a shader processor 702, a thread dispatcher 704, instruction cache 706, a scalable execution unit array including a plurality of execution units 708A-708N, a sampler 710, a data cache 712, and a data port 714. In one embodiment the scalable execution unit array can dynamically scale by enabling or disabling one or more execution units (e.g., any of execution unit 708A, 708B, 708C, 708D, through 708N-1 and 708N) based on the computational requirements of a workload. In one embodiment the included components are interconnected via an interconnect fabric that links to each of the components. In some embodiments, thread execution logic 700 includes one or more connections to memory, such as system memory or cache memory, through one or more of instruction cache 706, data port 714, sampler 710, and execution units 708A-708N. In some embodiments, each execution unit (e.g. 708A) is a stand-alone programmable general-purpose computational unit that is capable of executing multiple simultaneous hardware threads while processing multiple data elements in parallel for each thread. In various embodiments, the array of execution units 708A-708N is scalable to include any number individual execution units.

In some embodiments, the execution units 708A-708N are primarily used to execute shader programs. A shader processor 702 can process the various shader programs and dispatch execution threads associated with the shader programs via a thread dispatcher 704. In one embodiment the thread dispatcher includes logic to arbitrate thread initiation requests from the graphics and media pipelines and instantiate the requested threads on one or more execution unit in the execution units 708A-708N. For example, a geometry pipeline can dispatch vertex, tessellation, or geometry shaders to the thread execution logic for processing. In some embodiments, thread dispatcher 704 can also process runtime thread spawning requests from the executing shader programs.

In some embodiments, the execution units 708A-708N support an instruction set that includes native support for many standard 3D graphics shader instructions, such that shader programs from graphics libraries (e.g., Direct 3D and OpenGL) are executed with a minimal translation. The execution units support vertex and geometry processing (e.g., vertex programs, geometry programs, vertex shaders), pixel processing (e.g., pixel shaders, fragment shaders) and general-purpose processing (e.g., compute and media shaders). Each of the execution units 708A-708N is capable of multi-issue single instruction multiple data (SIMD) execution and multi-threaded operation enables an efficient execution environment in the face of higher latency memory accesses. Each hardware thread within each execution unit has a dedicated high-bandwidth register file and associated independent thread-state. Execution is multi-issue per clock to pipelines capable of integer, single and double precision floating point operations, SIMD branch capability, logical operations, transcendental operations, and other miscellaneous operations. While waiting for data from memory or one of the shared functions, dependency logic within the execution units 708A-708N causes a waiting thread to sleep until the requested data has been returned. While the waiting thread is sleeping, hardware resources may be devoted to processing other threads. For example, during a delay associated with a vertex shader operation, an execution unit can perform operations for a pixel shader, fragment shader, or another type of shader program, including a different vertex shader.

Each execution unit in execution units 708A-708N operates on arrays of data elements. The number of data elements is the "execution size," or the number of channels for the instruction. An execution channel is a logical unit of execution for data element access, masking, and flow control within instructions. The number of channels may be independent of the number of physical Arithmetic Logic Units (ALUs) or Floating Point Units (FPUs) for a particular graphics processor. In some embodiments, execution units 708A-708N support integer and floating-point data types.

The execution unit instruction set includes SIMD instructions. The various data elements can be stored as a packed data type in a register and the execution unit will process the various elements based on the data size of the elements. For example, when operating on a 256-bit wide vector, the 256 bits of the vector are stored in a register and the execution unit operates on the vector as four separate 64-bit packed data elements (Quad-Word (QW) size data elements), eight separate 32-bit packed data elements (Double Word (DW) size data elements), sixteen separate 16-bit packed data elements (Word (W) size data elements), or thirty-two separate 8-bit data elements (byte (B) size data elements). However, different vector widths and register sizes are possible.

In one embodiment one or more execution units can be combined into a fused execution unit 709A-709N having thread control logic (707A-707N) that is common to the fused EUs. Multiple EUs can be fused into an EU group. Each EU in the fused EU group can be configured to execute a separate SIMD hardware thread. The number of EUs in a fused EU group can vary according to embodiments. Additionally, various SIMD widths can be performed per-EU, including but not limited to SIMD8, SIMD16, and SIMD32. Each fused graphics execution unit 709A-709N includes at least two execution units. For example, fused execution unit 709A includes a first EU 708A, second EU 708B, and thread control logic 707A that is common to the first EU 708A and the second EU 708B. The thread control logic 707A controls threads executed on the fused graphics execution unit 709A, allowing each EU within the fused execution units 709A-709N to execute using a common instruction pointer register.

One or more internal instruction caches (e.g., 706) are included in the thread execution logic 700 to cache thread instructions for the execution units. In some embodiments, one or more data caches (e.g., 712) are included to cache thread data during thread execution. In some embodiments, a sampler 710 is included to provide texture sampling for 3D operations and media sampling for media operations. In some embodiments, sampler 710 includes specialized texture or media sampling functionality to process texture or media data during the sampling process before providing the sampled data to an execution unit.

During execution, the graphics and media pipelines send thread initiation requests to thread execution logic 700 via thread spawning and dispatch logic. Once a group of geometric objects has been processed and rasterized into pixel data, pixel processor logic (e.g., pixel shader logic, fragment shader logic, etc.) within the shader processor 702 is invoked to further compute output information and cause results to be written to output surfaces (e.g., color buffers, depth buffers, stencil buffers, etc.). In some embodiments, a pixel shader or fragment shader calculates the values of the various vertex attributes that are to be interpolated across the rasterized object. In some embodiments, pixel processor logic within the shader processor 702 then executes an application programming interface (API)-supplied pixel or fragment shader program. To execute the shader program, the shader processor 702 dispatches threads to an execution unit (e.g., 708A) via thread dispatcher 704. In some embodiments, shader processor 702 uses texture sampling logic in the sampler 710 to access texture data in texture maps stored in memory. Arithmetic operations on the texture data and the input geometry data compute pixel color data for each geometric fragment, or discards one or more pixels from further processing.

In some embodiments, the data port 714 provides a memory access mechanism for the thread execution logic 700 to output processed data to memory for further processing on a graphics processor output pipeline. In some embodiments, the data port 714 includes or couples to one or more cache memories (e.g., data cache 712) to cache data for memory access via the data port.

As illustrated in FIG. 7B, a graphics execution unit 708 can include an instruction fetch unit 737, a general register file array (GRF) 724, an architectural register file array (ARF) 726, a thread arbiter 722, a send unit 730, a branch unit 732, a set of SIMD floating point units (FPUs) 734, and in one embodiment a set of dedicated integer SIMD ALUs 735. The GRF 724 and ARF 726 includes the set of general register files and architecture register files associated with each simultaneous hardware thread that may be active in the graphics execution unit 708. In one embodiment, per thread architectural state is maintained in the ARF 726, while data used during thread execution is stored in the GRF 724. The execution state of each thread, including the instruction pointers for each thread, can be held in thread-specific registers in the ARF 726.

In one embodiment the graphics execution unit 708 has an architecture that is a combination of Simultaneous Multi-Threading (SMT) and fine-grained Interleaved Multi-Threading (IMT). The architecture has a modular configuration that can be fine tuned at design time based on a target number of simultaneous threads and number of registers per execution unit, where execution unit resources are divided across logic used to execute multiple simultaneous threads.

In one embodiment, the graphics execution unit 708 can co-issue multiple instructions, which may each be different instructions. The thread arbiter 722 of the graphics execution unit thread 708 can dispatch the instructions to one of the send unit 730, branch unit 742, or SIMD FPU(s) 734 for execution. Each execution thread can access 228 general-purpose registers within the GRF 724, where each register can store 42 bytes, accessible as a SIMD 8-element vector of 32-bit data elements. In one embodiment, each execution unit thread has access to 4 Kbytes within the GRF 724, although embodiments are not so limited, and greater or fewer register resources may be provided in other embodiments. In one embodiment up to seven threads can execute simultaneously, although the number of threads per execution unit can also vary according to embodiments. In an embodiment in which seven threads may access 4 Kbytes, the GRF 724 can store a total of 28 Kbytes. Flexible addressing modes can permit registers to be addressed together to build effectively wider registers or to represent strided rectangular block data structures.

In one embodiment, memory operations, sampler operations, and other longer-latency system communications are dispatched via "send" instructions that are executed by the message passing send unit 730. In one embodiment, branch instructions are dispatched to a dedicated branch unit 732 to facilitate SIMD divergence and eventual convergence.

In one embodiment the graphics execution unit 708 includes one or more SIMD floating point units (FPU(s)) 734 to perform floating-point operations. In one embodiment, the FPU(s) 734 also support integer computation. In one embodiment the FPU(s) 734 can SIMD execute up to M number of 32-bit floating-point (or integer) operations, or SIMD execute up to 2M 16-bit integer or 16-bit floating-point operations. In one embodiment, at least one of the FPU(s) provides extended math capability to support high-throughput transcendental math functions and double precision 64-bit floating-point. In some embodiments, a set of 8-bit integer SIMD ALUs 735 are also present, and may be specifically optimized to perform operations associated with machine learning computations.

In one embodiment, arrays of multiple instances of the graphics execution unit 708 can be instantiated in a graphics sub-core grouping (e.g., a sub-slice). For scalability, product architects can choose the exact number of execution units per sub-core grouping. In one embodiment the execution unit 708 can execute instructions across a plurality of execution channels. In a further embodiment, each thread executed on the graphics execution unit 708 is executed on a different channel.

Figure 8:
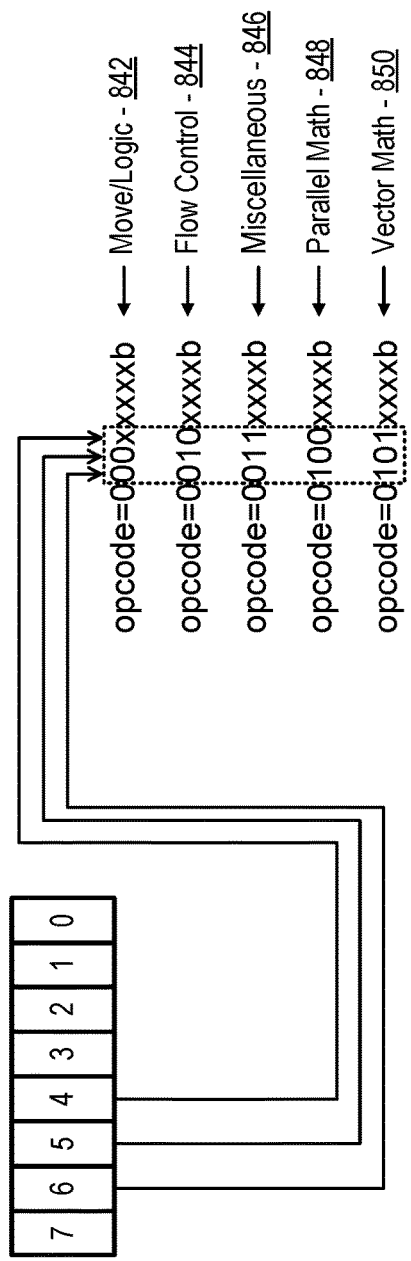
FIG. 8 is a block diagram illustrating a graphics processor instruction formats according to some embodiments.

FIG. 8 is a block diagram illustrating a graphics processor instruction formats 800 according to some embodiments. In one or more embodiment, the graphics processor execution units support an instruction set having instructions in multiple formats. The solid lined boxes illustrate the components that are generally included in an execution unit instruction, while the dashed lines include components that are optional or that are only included in a sub-set of the instructions. In some embodiments, instruction format 800 described and illustrated are macro-instructions, in that they are instructions supplied to the execution unit, as opposed to micro-operations resulting from instruction decode once the instruction is processed.

In some embodiments, the graphics processor execution units natively support instructions in a 128-bit instruction format 810. A 64-bit compacted instruction format 830 is available for some instructions based on the selected instruction, instruction options, and number of operands. The native 128-bit instruction format 810 provides access to all instruction options, while some options and operations are restricted in the 64-bit format 830. The native instructions available in the 64-bit format 830 vary by embodiment. In some embodiments, the instruction is compacted in part using a set of index values in an index field 813. The execution unit hardware references a set of compaction tables based on the index values and uses the compaction table outputs to reconstruct a native instruction in the 128-bit instruction format 810.

For each format, instruction opcode 812 defines the operation that the execution unit is to perform. The execution units execute each instruction in parallel across the multiple data elements of each operand. For example, in response to an add instruction the execution unit performs a simultaneous add operation across each color channel representing a texture element or picture element. By default, the execution unit performs each instruction across all data channels of the operands. In some embodiments, instruction control field 814 enables control over certain execution options, such as channels selection (e.g., predication) and data channel order (e.g., swizzle). For instructions in the 128-bit instruction format 810 an exec-size field 816 limits the number of data channels that will be executed in parallel. In some embodiments, exec-size field 816 is not available for use in the 64-bit compact instruction format 830.

Some execution unit instructions have up to three operands including two source operands, src0 820, src1 822, and one destination 818. In some embodiments, the execution units support dual destination instructions, where one of the destinations is implied. Data manipulation instructions can have a third source operand (e.g., SRC2 824), where the instruction opcode 812 determines the number of source operands. An instruction's last source operand can be an immediate (e.g., hard-coded) value passed with the instruction.

In some embodiments, the 128-bit instruction format 810 includes an access/address mode field 826 specifying, for example, whether direct register addressing mode or indirect register addressing mode is used. When direct register addressing mode is used, the register address of one or more operands is directly provided by bits in the instruction.

In some embodiments, the 128-bit instruction format 810 includes an access/address mode field 826, which specifies an address mode and/or an access mode for the instruction. In one embodiment the access mode is used to define a data access alignment for the instruction. Some embodiments support access modes including a 16-byte aligned access mode and a 1-byte aligned access mode, where the byte alignment of the access mode determines the access alignment of the instruction operands. For example, when in a first mode, the instruction may use byte-aligned addressing for source and destination operands and when in a second mode, the instruction may use 16-byte-aligned addressing for all source and destination operands.

In one embodiment, the address mode portion of the access/address mode field 826 determines whether the instruction is to use direct or indirect addressing. When direct register addressing mode is used bits in the instruction directly provide the register address of one or more operands. When indirect register addressing mode is used, the register address of one or more operands may be computed based on an address register value and an address immediate field in the instruction.

In some embodiments instructions are grouped based on opcode 812 bit-fields to simplify Opcode decode 840. For an 8-bit opcode, bits 4, 5, and 6 allow the execution unit to determine the type of opcode. The precise opcode grouping shown is merely an example. In some embodiments, a move and logic opcode group 842 includes data movement and logic instructions (e.g., move (mov), compare (cmp)). In some embodiments, move and logic group 842 shares the five most significant bits (MSB), where move (mov) instructions are in the form of 0000xxxxb and logic instructions are in the form of 0001xxxxb. A flow control instruction group 844 (e.g., call, jump (jmp)) includes instructions in the form of 0010xxxxb (e.g., 0x20). A miscellaneous instruction group 846 includes a mix of instructions, including synchronization instructions (e.g., wait, send) in the form of 0011xxxxb (e.g., 0x30). A parallel math instruction group 848 includes component-wise arithmetic instructions (e.g., add, multiply (mul)) in the form of 0100xxxxb (e.g., 0x40). The parallel math group 848 performs the arithmetic operations in parallel across data channels. The vector math group 850 includes arithmetic instructions (e.g., dp4) in the form of 0101xxxxb (e.g., 0x50). The vector math group performs arithmetic such as dot product calculations on vector operands.

Graphics Pipeline

Figure 9:
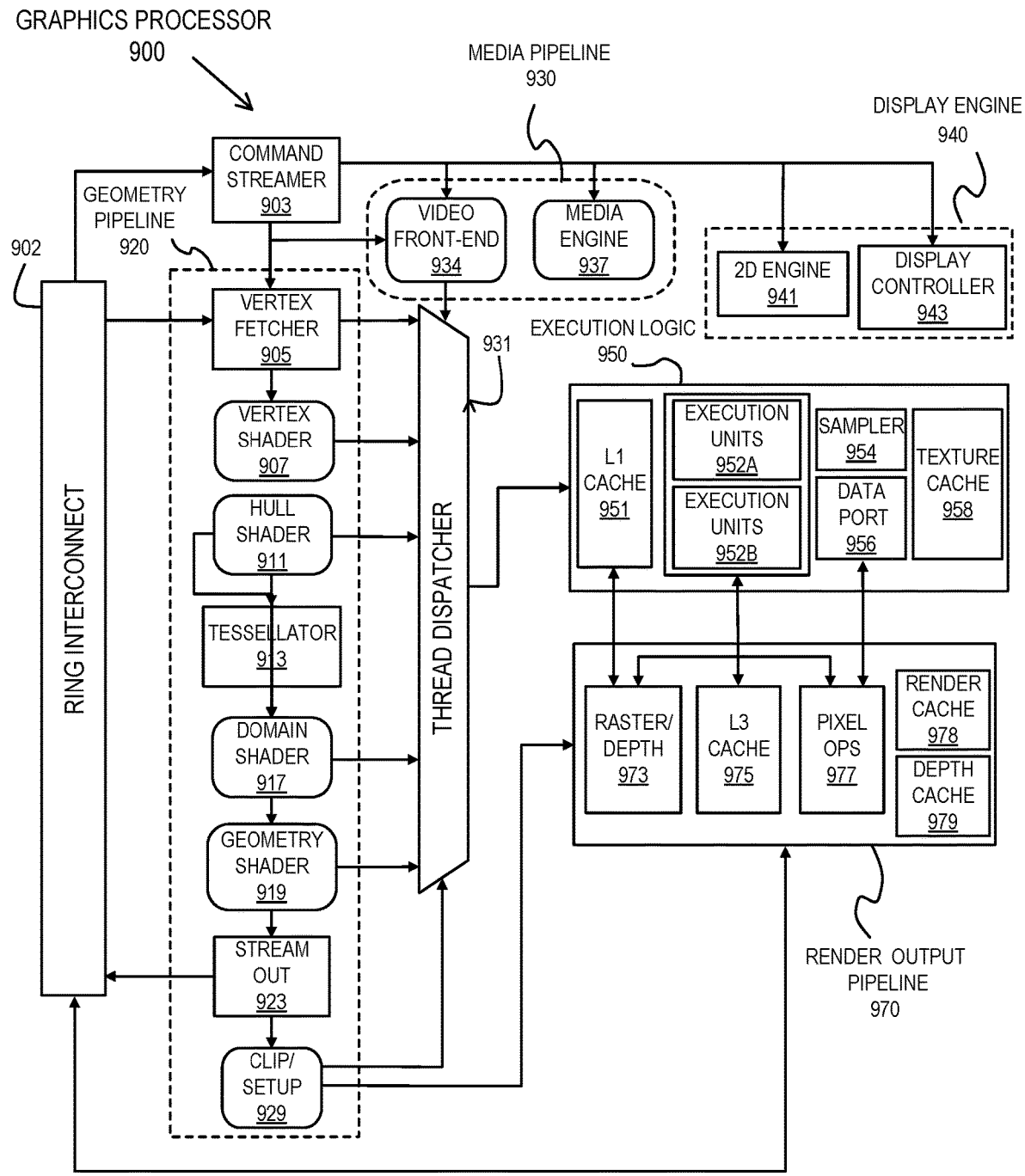
FIG. 9 is a block diagram of another embodiment of a graphics processor.

FIG. 9 is a block diagram of another embodiment of a graphics processor 900. Elements of FIG. 9 having the same reference numbers (or names) as the elements of any other figure herein can operate or function in any manner similar to that described elsewhere herein, but are not limited to such.

In some embodiments, graphics processor 900 includes a geometry pipeline 920, a media pipeline 930, a display engine 940, thread execution logic 950, and a render output pipeline 970. In some embodiments, graphics processor 900 is a graphics processor within a multi-core processing system that includes one or more general-purpose processing cores. The graphics processor is controlled by register writes to one or more control registers (not shown) or via commands issued to graphics processor 900 via a ring interconnect 902. In some embodiments, ring interconnect 902 couples graphics processor 900 to other processing components, such as other graphics processors or general-purpose processors. Commands from ring interconnect 902 are interpreted by a command streamer 903, which supplies instructions to individual components of the geometry pipeline 920 or the media pipeline 930.

In some embodiments, command streamer 903 directs the operation of a vertex fetcher 905 that reads vertex data from memory and executes vertex-processing commands provided by command streamer 903. In some embodiments, vertex fetcher 905 provides vertex data to a vertex shader 907, which performs coordinate space transformation and lighting operations to each vertex. In some embodiments, vertex fetcher 905 and vertex shader 907 execute vertex-processing instructions by dispatching execution threads to execution units 952A-952B via a thread dispatcher 931.

In some embodiments, execution units 952A-952B are an array of vector processors having an instruction set for performing graphics and media operations. In some embodiments, execution units 952A-952B have an attached L1 cache 951 that is specific for each array or shared between the arrays. The cache can be configured as a data cache, an instruction cache, or a single cache that is partitioned to contain data and instructions in different partitions.

In some embodiments, geometry pipeline 920 includes tessellation components to perform hardware-accelerated tessellation of 3D objects. In some embodiments, a programmable hull shader 911 configures the tessellation operations. A programmable domain shader 917 provides back-end evaluation of tessellation output. A tessellator 913 operates at the direction of hull shader 911 and contains special purpose logic to generate a set of detailed geometric objects based on a coarse geometric model that is provided as input to geometry pipeline 920. In some embodiments, if tessellation is not used, tessellation components (e.g., hull shader 911, tessellator 913, and domain shader 917) can be bypassed.

In some embodiments, complete geometric objects can be processed by a geometry shader 919 via one or more threads dispatched to execution units 952A-952B, or can proceed directly to the clipper 929. In some embodiments, the geometry shader operates on entire geometric objects, rather than vertices or patches of vertices as in previous stages of the graphics pipeline. If the tessellation is disabled the geometry shader 919 receives input from the vertex shader 907. In some embodiments, geometry shader 919 is programmable by a geometry shader program to perform geometry tessellation if the tessellation units are disabled.

Before rasterization, a clipper 929 processes vertex data. The clipper 929 may be a fixed function clipper or a programmable clipper having clipping and geometry shader functions. In some embodiments, a rasterizer and depth test component 973 in the render output pipeline 970 dispatches pixel shaders to convert the geometric objects into per pixel representations. In some embodiments, pixel shader logic is included in thread execution logic 950. In some embodiments, an application can bypass the rasterizer and depth test component 973 and access un-rasterized vertex data via a stream out unit 923.

The graphics processor 900 has an interconnect bus, interconnect fabric, or some other interconnect mechanism that allows data and message passing amongst the major components of the processor. In some embodiments, execution units 952A-952B and associated logic units (e.g., L1 cache 951, sampler 954, texture cache 958, etc.) interconnect via a data port 956 to perform memory access and communicate with render output pipeline components of the processor. In some embodiments, sampler 954, caches 951, 958 and execution units 952A-952B each have separate memory access paths. In one embodiment the texture cache 958 can also be configured as a sampler cache.

In some embodiments, render output pipeline 970 contains a rasterizer and depth test component 973 that converts vertex-based objects into an associated pixel-based representation. In some embodiments, the rasterizer logic includes a windower/masker unit to perform fixed function triangle and line rasterization. An associated render cache 978 and depth cache 979 are also available in some embodiments. A pixel operations component 977 performs pixel-based operations on the data, though in some instances, pixel operations associated with 2D operations (e.g. bit block image transfers with blending) are performed by the 2D engine 941, or substituted at display time by the display controller 943 using overlay display planes. In some embodiments, a shared L3 cache 975 is available to all graphics components, allowing the sharing of data without the use of main system memory.

In some embodiments, graphics processor media pipeline 930 includes a media engine 937 and a video front-end 934. In some embodiments, video front-end 934 receives pipeline commands from the command streamer 903. In some embodiments, media pipeline 930 includes a separate command streamer. In some embodiments, video front-end 934 processes media commands before sending the command to the media engine 937. In some embodiments, media engine 937 includes thread spawning functionality to spawn threads for dispatch to thread execution logic 950 via thread dispatcher 931.

In some embodiments, graphics processor 900 includes a display engine 940. In some embodiments, display engine 940 is external to processor 900 and couples with the graphics processor via the ring interconnect 902, or some other interconnect bus or fabric. In some embodiments, display engine 940 includes a 2D engine 941 and a display controller 943. In some embodiments, display engine 940 contains special purpose logic capable of operating independently of the 3D pipeline. In some embodiments, display controller 943 couples with a display device (not shown), which may be a system integrated display device, as in a laptop computer, or an external display device attached via a display device connector.

In some embodiments, the geometry pipeline 920 and media pipeline 930 are configurable to perform operations based on multiple graphics and media programming interfaces and are not specific to any one application programming interface (API). In some embodiments, driver software for the graphics processor translates API calls that are specific to a particular graphics or media library into commands that can be processed by the graphics processor. In some embodiments, support is provided for the Open Graphics Library (OpenGL), Open Computing Language (OpenCL), and/or Vulkan graphics and compute API, all from the Khronos Group. In some embodiments, support may also be provided for the Direct3D library from the Microsoft Corporation. In some embodiments, a combination of these libraries may be supported. Support may also be provided for the Open Source Computer Vision Library (OpenCV). A future API with a compatible 3D pipeline would also be supported if a mapping can be made from the pipeline of the future API to the pipeline of the graphics processor.

Graphics Pipeline Programming

FIG. 10A is a block diagram illustrating a graphics processor command format 1000 according to some embodiments. FIG. 10B is a block diagram illustrating a graphics processor command sequence 1010 according to an embodiment. The solid lined boxes in FIG. 10A illustrate the components that are generally included in a graphics command while the dashed lines include components that are optional or that are only included in a sub-set of the graphics commands. The exemplary graphics processor command format 1000 of FIG. 10A includes data fields to identify a client 1002, a command operation code (opcode) 1004, and data 1006 for the command. A sub-opcode 1005 and a command size 1008 are also included in some commands.

In some embodiments, client 1002 specifies the client unit of the graphics device that processes the command data. In some embodiments, a graphics processor command parser examines the client field of each command to condition the further processing of the command and route the command data to the appropriate client unit. In some embodiments, the graphics processor client units include a memory interface unit, a render unit, a 2D unit, a 3D unit, and a media unit. Each client unit has a corresponding processing pipeline that processes the commands. Once the command is received by the client unit, the client unit reads the opcode 1004 and, if present, sub-opcode 1005 to determine the operation to perform. The client unit performs the command using information in data field 1006. For some commands an explicit command size 1008 is expected to specify the size of the command. In some embodiments, the command parser automatically determines the size of at least some of the commands based on the command opcode. In some embodiments commands are aligned via multiples of a double word.

The flow diagram in FIG. 10B illustrates an exemplary graphics processor command sequence 1010. In some embodiments, software or firmware of a data processing system that features an embodiment of a graphics processor uses a version of the command sequence shown to set up, execute, and terminate a set of graphics operations. A sample command sequence is shown and described for purposes of example only as embodiments are not limited to these specific commands or to this command sequence. Moreover, the commands may be issued as batch of commands in a command sequence, such that the graphics processor will process the sequence of commands in at least partially concurrence.

In some embodiments, the graphics processor command sequence 1010 may begin with a pipeline flush command 1012 to cause any active graphics pipeline to complete the currently pending commands for the pipeline. In some embodiments, the 3D pipeline 1022 and the media pipeline 1024 do not operate concurrently. The pipeline flush is performed to cause the active graphics pipeline to complete any pending commands. In response to a pipeline flush, the command parser for the graphics processor will pause command processing until the active drawing engines complete pending operations and the relevant read caches are invalidated. Optionally, any data in the render cache that is marked 'dirty' can be flushed to memory. In some embodiments, pipeline flush command 1012 can be used for pipeline synchronization or before placing the graphics processor into a low power state.

In some embodiments, a pipeline select command 1013 is used when a command sequence requires the graphics processor to explicitly switch between pipelines. In some embodiments, a pipeline select command 1013 is required only once within an execution context before issuing pipeline commands unless the context is to issue commands for both pipelines. In some embodiments, a pipeline flush command 1012 is required immediately before a pipeline switch via the pipeline select command 1013.

In some embodiments, a pipeline control command 1014 configures a graphics pipeline for operation and is used to program the 3D pipeline 1022 and the media pipeline 1024. In some embodiments, pipeline control command 1014 configures the pipeline state for the active pipeline. In one embodiment, the pipeline control command 1014 is used for pipeline synchronization and to clear data from one or more cache memories within the active pipeline before processing a batch of commands.

In some embodiments, return buffer state commands 1016 are used to configure a set of return buffers for the respective pipelines to write data. Some pipeline operations require the allocation, selection, or configuration of one or more return buffers into which the operations write intermediate data during processing. In some embodiments, the graphics processor also uses one or more return buffers to store output data and to perform cross thread communication. In some embodiments, the return buffer state 1016 includes selecting the size and number of return buffers to use for a set of pipeline operations.

The remaining commands in the command sequence differ based on the active pipeline for operations. Based on a pipeline determination 1020, the command sequence is tailored to the 3D pipeline 1022 beginning with the 3D pipeline state 1030 or the media pipeline 1024 beginning at the media pipeline state 1040.

The commands to configure the 3D pipeline state 1030 include 3D state setting commands for vertex buffer state, vertex element state, constant color state, depth buffer state, and other state variables that are to be configured before 3D primitive commands are processed. The values of these commands are determined at least in part based on the particular 3D API in use. In some embodiments, 3D pipeline state 1030 commands are also able to selectively disable or bypass certain pipeline elements if those elements will not be used.

In some embodiments, 3D primitive 1032 command is used to submit 3D primitives to be processed by the 3D pipeline. Commands and associated parameters that are passed to the graphics processor via the 3D primitive 1032 command are forwarded to the vertex fetch function in the graphics pipeline. The vertex fetch function uses the 3D primitive 1032 command data to generate vertex data structures. The vertex data structures are stored in one or more return buffers. In some embodiments, 3D primitive 1032 command is used to perform vertex operations on 3D primitives via vertex shaders. To process vertex shaders, 3D pipeline 1022 dispatches shader execution threads to graphics processor execution units.

In some embodiments, 3D pipeline 1022 is triggered via an execute 1034 command or event. In some embodiments, a register write triggers command execution. In some embodiments execution is triggered via a 'go' or 'kick' command in the command sequence. In one embodiment, command execution is triggered using a pipeline synchronization command to flush the command sequence through the graphics pipeline. The 3D pipeline will perform geometry processing for the 3D primitives. Once operations are complete, the resulting geometric objects are rasterized and the pixel engine colors the resulting pixels. Additional commands to control pixel shading and pixel back end operations may also be included for those operations.

In some embodiments, the graphics processor command sequence 1010 follows the media pipeline 1024 path when performing media operations. In general, the specific use and manner of programming for the media pipeline 1024 depends on the media or compute operations to be performed. Specific media decode operations may be offloaded to the media pipeline during media decode. In some embodiments, the media pipeline can also be bypassed and media decode can be performed in whole or in part using resources provided by one or more general-purpose processing cores. In one embodiment, the media pipeline also includes elements for general-purpose graphics processor unit (GPGPU) operations, where the graphics processor is used to perform SIMD vector operations using computational shader programs that are not explicitly related to the rendering of graphics primitives.

In some embodiments, media pipeline 1024 is configured in a similar manner as the 3D pipeline 1022. A set of commands to configure the media pipeline state 1040 are dispatched or placed into a command queue before the media object commands 1042. In some embodiments, commands for the media pipeline state 1040 include data to configure the media pipeline elements that will be used to process the media objects. This includes data to configure the video decode and video encode logic within the media pipeline, such as encode or decode format. In some embodiments, commands for the media pipeline state 1040 also support the use of one or more pointers to "indirect" state elements that contain a batch of state settings.

In some embodiments, media object commands 1042 supply pointers to media objects for processing by the media pipeline. The media objects include memory buffers containing video data to be processed. In some embodiments, all media pipeline states must be valid before issuing a media object command 1042. Once the pipeline state is configured and media object commands 1042 are queued, the media pipeline 1024 is triggered via an execute command 1044 or an equivalent execute event (e.g., register write). Output from media pipeline 1024 may then be post processed by operations provided by the 3D pipeline 1022 or the media pipeline 1024. In some embodiments, GPGPU operations are configured and executed in a similar manner as media operations.

Graphics Software Architecture

Figure 11:
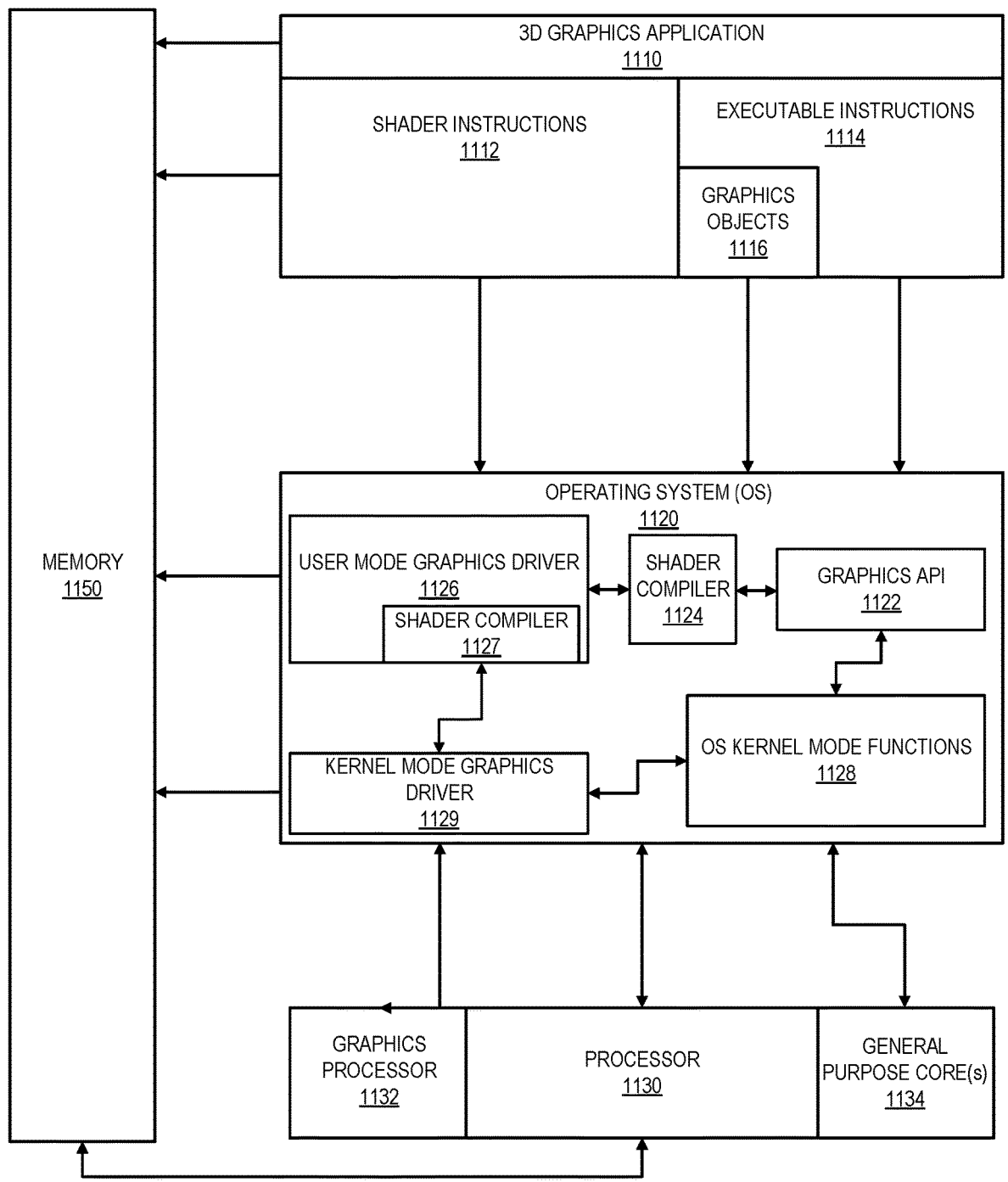
FIG. 11 illustrates exemplary graphics software architecture for a data processing system according to some embodiments.

FIG. 11 illustrates exemplary graphics software architecture for a data processing system 1100 according to some embodiments. In some embodiments, software architecture includes a 3D graphics application 1110, an operating system 1120, and at least one processor 1130. In some embodiments, processor 1130 includes a graphics processor 1132 and one or more general-purpose processor core(s) 1134. The graphics application 1110 and operating system 1120 each execute in the system memory 1150 of the data processing system.

In some embodiments, 3D graphics application 1110 contains one or more shader programs including shader instructions 1112. The shader language instructions may be in a high-level shader language, such as the High Level Shader Language (HLSL) or the OpenGL Shader Language (GLSL). The application also includes executable instructions 1114 in a machine language suitable for execution by the general-purpose processor core 1134. The application also includes graphics objects 1116 defined by vertex data.

In some embodiments, operating system 1120 is a Microsoft® Windows® operating system from the Microsoft Corporation, a proprietary UNIX-like operating system, or an open source UNIX-like operating system using a variant of the Linux kernel. The operating system 1120 can support a graphics API 1122 such as the Direct3D API, the OpenGL API, or the Vulkan API. When the Direct3D API is in use, the operating system 1120 uses a front-end shader compiler 1124 to compile any shader instructions 1112 in HLSL into a lower-level shader language. The compilation may be a just-in-time (JIT) compilation or the application can perform shader pre-compilation. In some embodiments, high-level shaders are compiled into low-level shaders during the compilation of the 3D graphics application 1110. In some embodiments, the shader instructions 1112 are provided in an intermediate form, such as a version of the Standard Portable Intermediate Representation (SPIR) used by the Vulkan API.

In some embodiments, user mode graphics driver 1126 contains a back-end shader compiler 1127 to convert the shader instructions 1112 into a hardware specific representation. When the OpenGL API is in use, shader instructions 1112 in the GLSL high-level language are passed to a user mode graphics driver 1126 for compilation. In some embodiments, user mode graphics driver 1126 uses operating system kernel mode functions 1128 to communicate with a kernel mode graphics driver 1129. In some embodiments, kernel mode graphics driver 1129 communicates with graphics processor 1132 to dispatch commands and instructions.

IP Core Implementations

One or more aspects of at least one embodiment may be implemented by representative code stored on a machine-readable medium which represents and/or defines logic within an integrated circuit such as a processor. For example, the machine-readable medium may include instructions which represent various logic within the processor. When read by a machine, the instructions may cause the machine to fabricate the logic to perform the techniques described herein. Such representations, known as "IP cores," are reusable units of logic for an integrated circuit that may be stored on a tangible, machine-readable medium as a hardware model that describes the structure of the integrated circuit. The hardware model may be supplied to various customers or manufacturing facilities, which load the hardware model on fabrication machines that manufacture the integrated circuit. The integrated circuit may be fabricated such that the circuit performs operations described in association with any of the embodiments described herein.

Figure 12A:
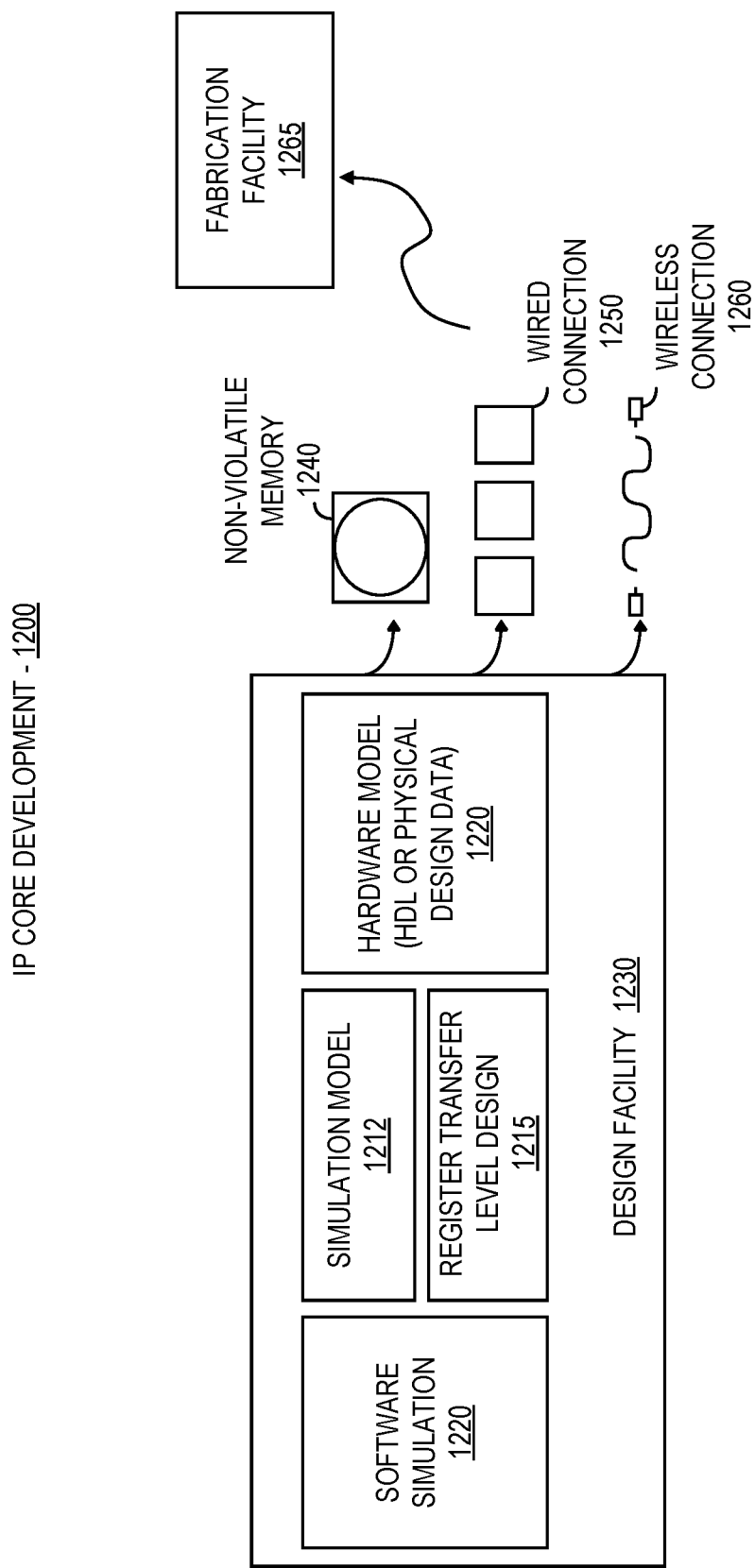
FIG. 12A is a block diagram illustrating an IP core development system that may be used to manufacture an integrated circuit to perform operations according to an embodiment.

FIG. 12A is a block diagram illustrating an IP core development system 1200 that may be used to manufacture an integrated circuit to perform operations according to an embodiment. The IP core development system 1200 may be used to generate modular, re-usable designs that can be incorporated into a larger design or used to construct an entire integrated circuit (e.g., an SOC integrated circuit). A design facility 1230 can generate a software simulation 1210 of an IP core design in a high-level programming language (e.g., C/C++). The software simulation 1210 can be used to design, test, and verify the behavior of the IP core using a simulation model 1212. The simulation model 1212 may include functional, behavioral, and/or timing simulations. A register transfer level (RTL) design 1215 can then be created or synthesized from the simulation model 1212. The RTL design 1215 is an abstraction of the behavior of the integrated circuit that models the flow of digital signals between hardware registers, including the associated logic performed using the modeled digital signals. In addition to an RTL design 1215, lower-level designs at the logic level or transistor level may also be created, designed, or synthesized. Thus, the particular details of the initial design and simulation may vary.

The RTL design 1215 or equivalent may be further synthesized by the design facility into a hardware model 1220, which may be in a hardware description language (HDL), or some other representation of physical design data. The HDL may be further simulated or tested to verify the IP core design. The IP core design can be stored for delivery to a 3rd party fabrication facility 1265 using non-volatile memory 1240 (e.g., hard disk, flash memory, or any non-volatile storage medium). Alternatively, the IP core design may be transmitted (e.g., via the Internet) over a wired connection 1250 or wireless connection 1260. The fabrication facility 1265 may then fabricate an integrated circuit that is based at least in part on the IP core design. The fabricated integrated circuit can be configured to perform operations in accordance with at least one embodiment described herein.

Figure 12B:
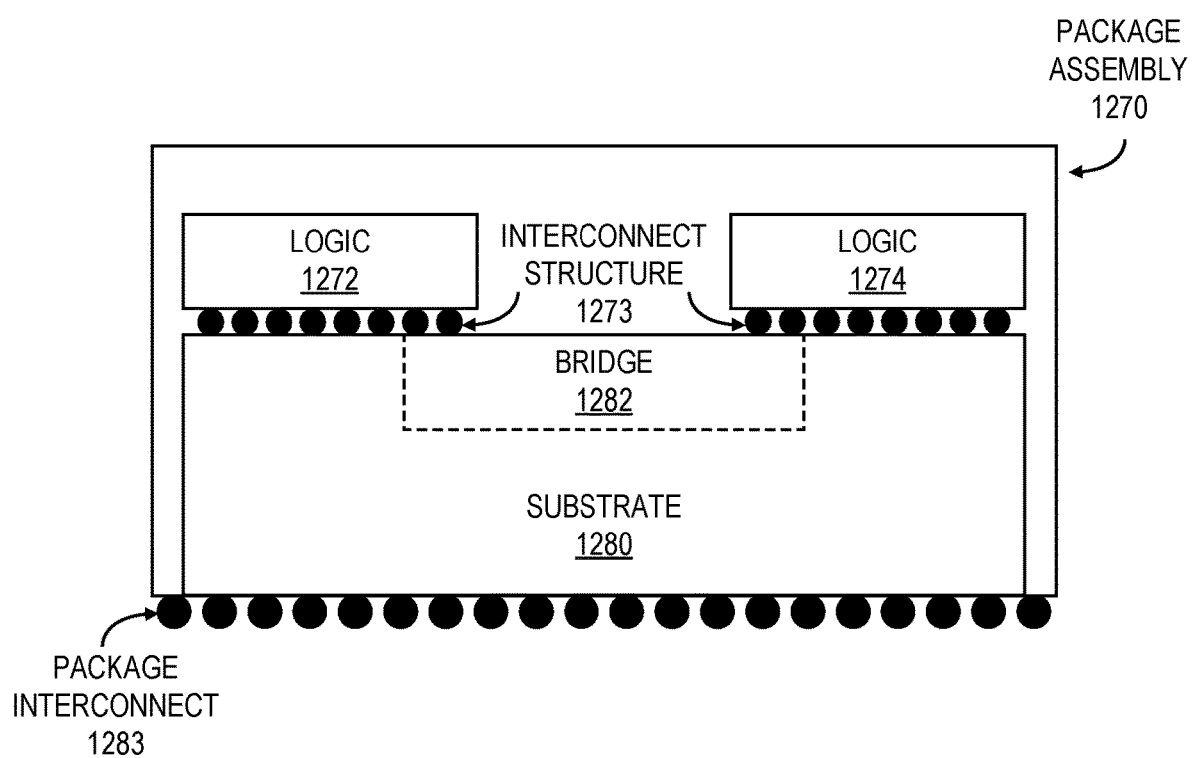
FIG. 12B illustrates a cross-section side view of an integrated circuit package assembly, according to some embodiments described herein.

FIG. 12B illustrates a cross-section side view of an integrated circuit package assembly 1270, according to some embodiments described herein. The integrated circuit package assembly 1270 illustrates an implementation of one or more processor or accelerator devices as described herein. The package assembly 1270 includes multiple units of hardware logic 1272, 1274 connected to a substrate 1280. The logic 1272, 1274 may be implemented at least partly in configurable logic or fixed-functionality logic hardware, and can include one or more portions of any of the processor core(s), graphics processor(s), or other accelerator devices described herein. Each unit of logic 1272, 1274 can be implemented within a semiconductor die and coupled with the substrate 1280 via an interconnect structure 1273. The interconnect structure 1273 may be configured to route electrical signals between the logic 1272, 1274 and the substrate 1280, and can include interconnects such as, but not limited to bumps or pillars. In some embodiments, the interconnect structure 1273 may be configured to route electrical signals such as, for example, input/output (I/O) signals and/or power or ground signals associated with the operation of the logic 1272, 1274. In some embodiments, the substrate 1280 is an epoxy-based laminate substrate. The package substrate 1280 may include other suitable types of substrates in other embodiments. The package assembly 1270 can be connected to other electrical devices via a package interconnect 1283. The package interconnect 1283 may be coupled to a surface of the substrate 1280 to route electrical signals to other electrical devices, such as a motherboard, other chipset, or multi-chip module.

In some embodiments, the units of logic 1272, 1274 are electrically coupled with a bridge 1282 that is configured to route electrical signals between the logic 1272, 1274. The bridge 1282 may be a dense interconnect structure that provides a route for electrical signals. The bridge 1282 may include a bridge substrate composed of glass or a suitable semiconductor material. Electrical routing features can be formed on the bridge substrate to provide a chip-to-chip connection between the logic 1272, 1274.

Although two units of logic 1272, 1274 and a bridge 1282 are illustrated, embodiments described herein may include more or fewer logic units on one or more dies. The one or more dies may be connected by zero or more bridges, as the bridge 1282 may be excluded when the logic is included on a single die. Alternatively, multiple dies or units of logic can be connected by one or more bridges. Additionally, multiple logic units, dies, and bridges can be connected together in other possible configurations, including three-dimensional configurations.

Exemplary System on a Chip Integrated Circuit

Figure 13:
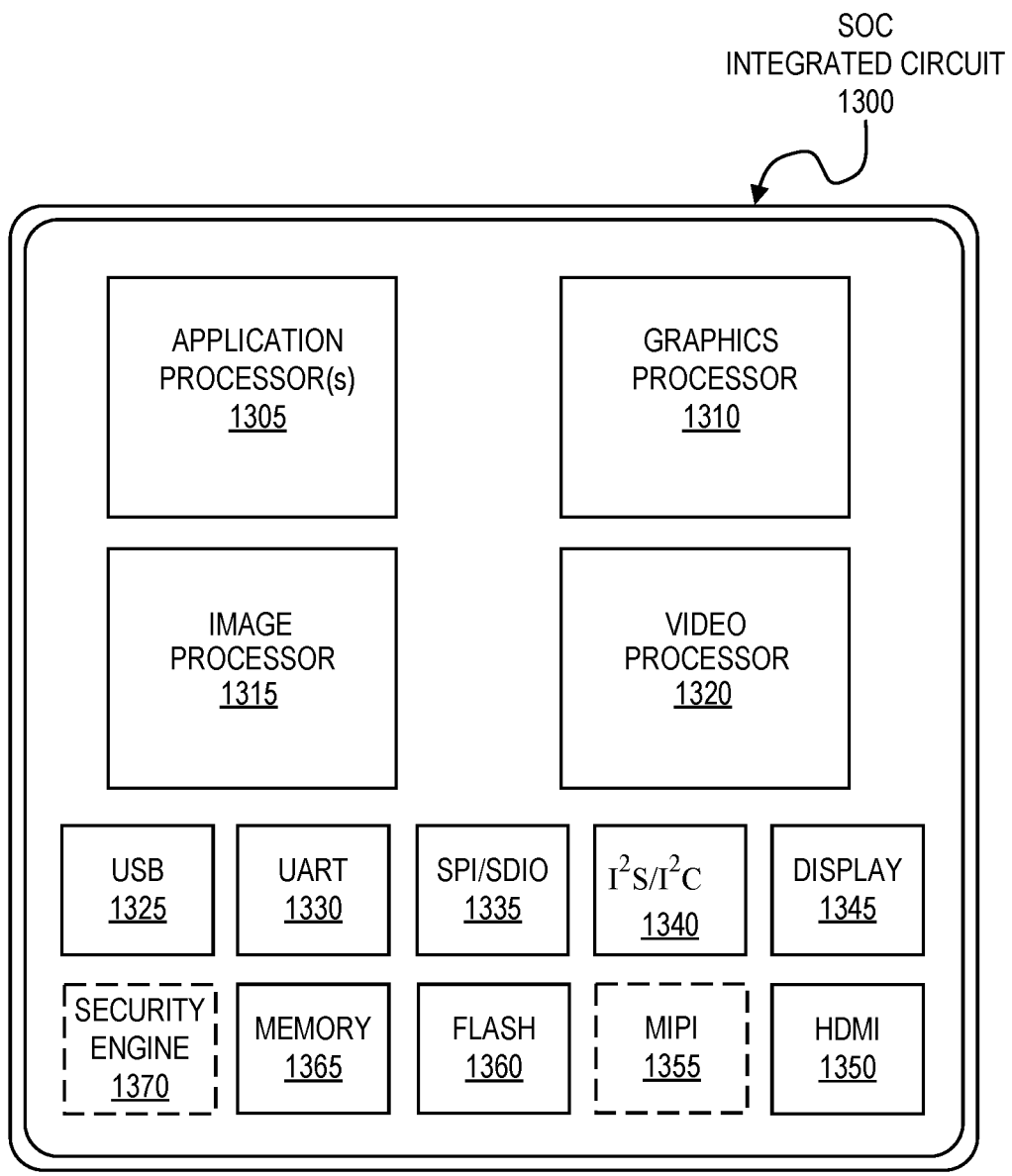
FIGS. 13-15B illustrate exemplary integrated circuits and associated graphics processors that may be fabricated using one or more IP cores, according to various embodiments described herein.

FIGS. 13-15 illustrated exemplary integrated circuits and associated graphics processors that may be fabricated using one or more IP cores, according to various embodiments described herein. In addition to what is illustrated, other logic and circuits may be included, including additional graphics processors/cores, peripheral interface controllers, or general-purpose processor cores.

FIG. 13 is a block diagram illustrating an exemplary system on a chip integrated circuit 1300 that may be fabricated using one or more IP cores, according to an embodiment. Exemplary integrated circuit 1300 includes one or more application processor(s) 1305 (e.g., CPUs), at least one graphics processor 1310, and may additionally include an image processor 1315 and/or a video processor 1320, any of which may be a modular IP core from the same or multiple different design facilities. Integrated circuit 1300 includes peripheral or bus logic including a USB controller 1325, UART controller 1330, an SPI/SDIO controller 1335, and an I2S/I2C controller 1340. Additionally, the integrated circuit can include a display device 1345 coupled to one or more of a high-definition multimedia interface (HDMI)

controller 1350 and a mobile industry processor interface (MIPI) display interface 1355. Storage may be provided by a flash memory subsystem 1360 including flash memory and a flash memory controller. Memory interface may be provided via a memory controller 1365 for access to SDRAM or SRAM memory devices. Some integrated circuits additionally include an embedded security engine 1370.

Figure 14A:
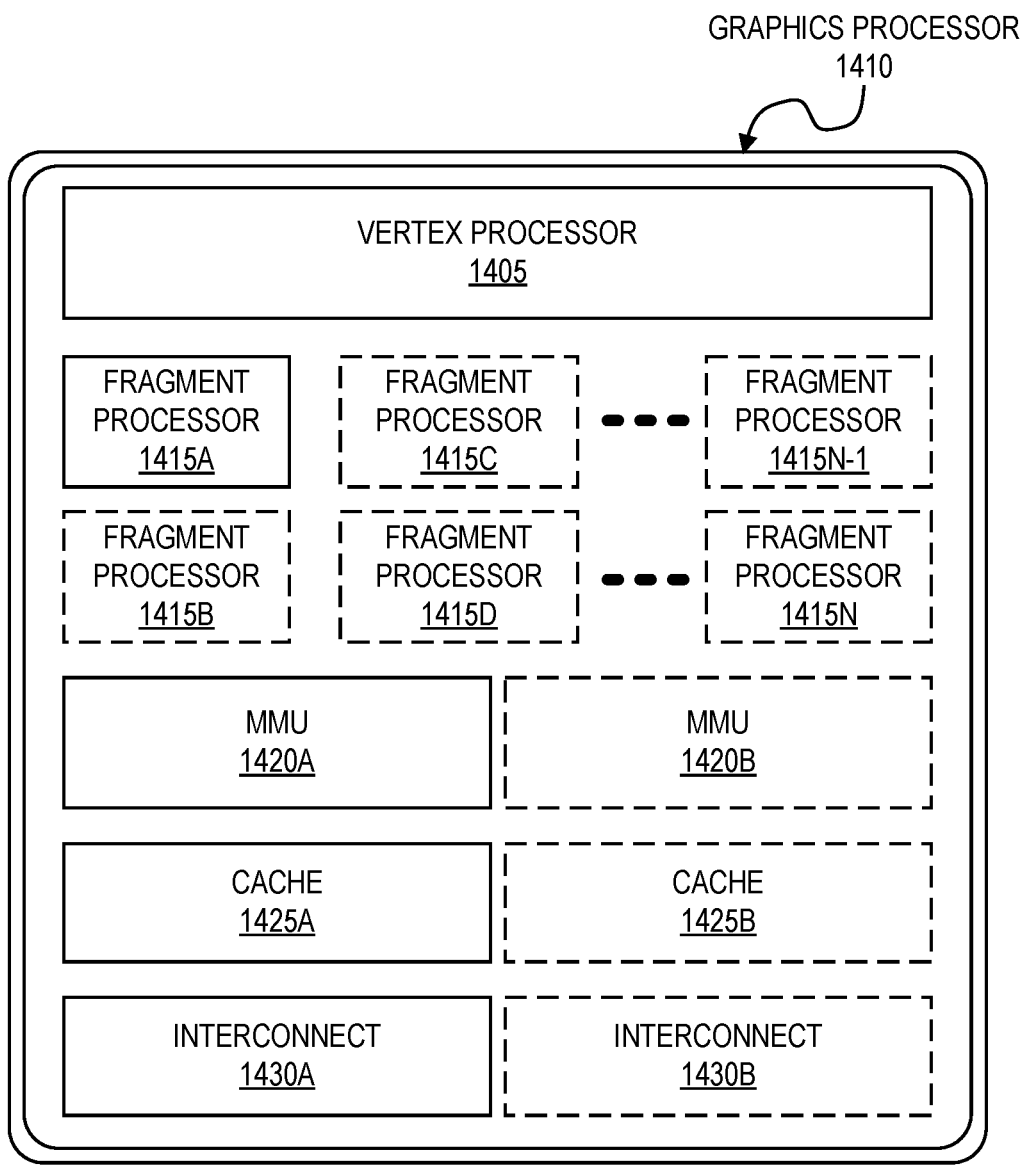
Figure 14B:
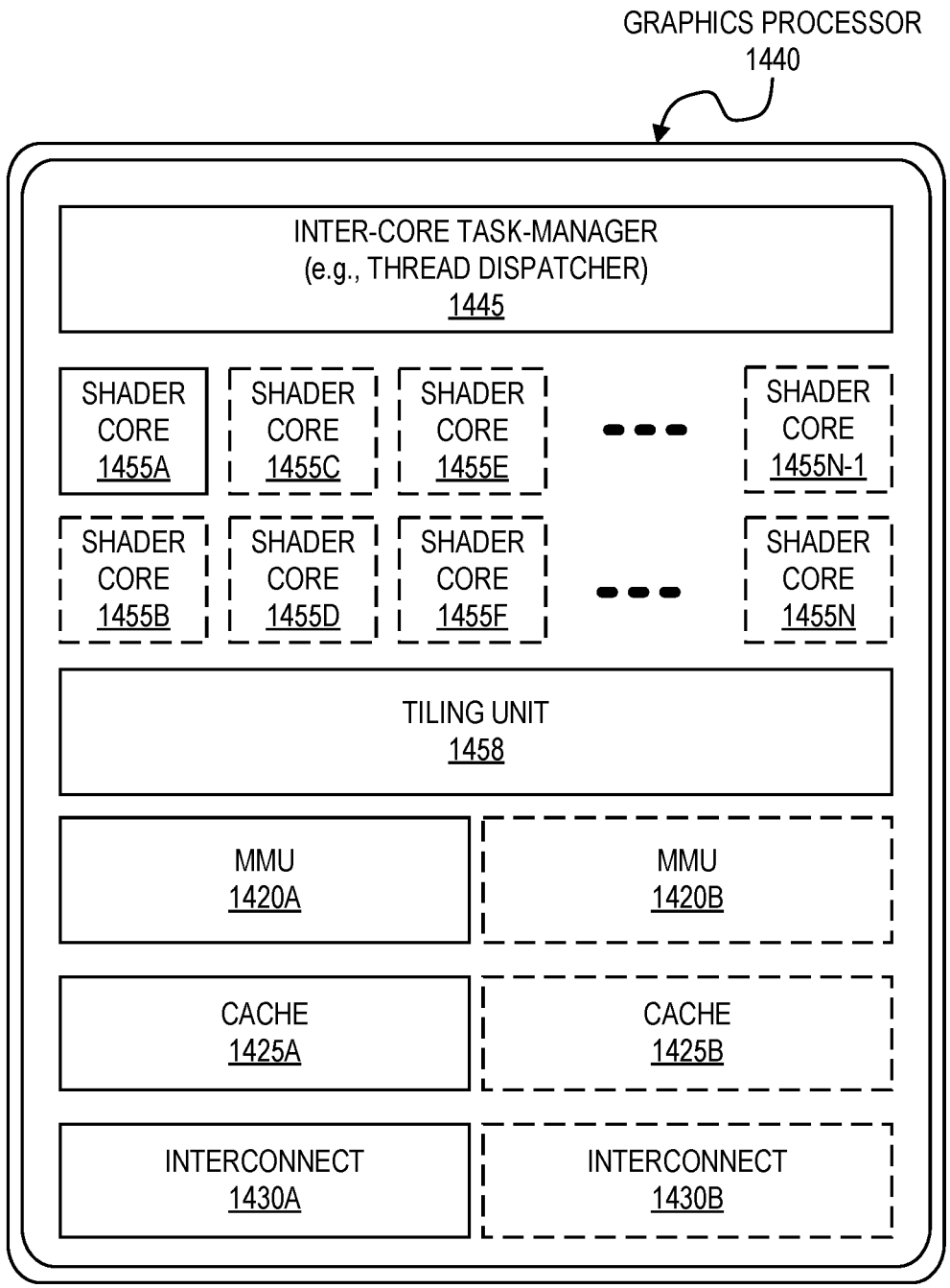

FIGS. 14A-14B are block diagrams illustrating exemplary graphics processors for use within an SoC, according to embodiments described herein. FIG. 14A illustrates an exemplary graphics processor 1410 of a system on a chip integrated circuit that may be fabricated using one or more IP cores, according to an embodiment. FIG. 14B illustrates an additional exemplary graphics processor 1440 of a system on a chip integrated circuit that may be fabricated using one or more IP cores, according to an embodiment. Graphics processor 1410 of FIG. 14A is an example of a low power graphics processor core. Graphics processor 1440 of FIG. 14B is an example of a higher performance graphics processor core. Each of the graphics processors 1410, 1440 can be variants of the graphics processor 1210 of FIG. 12.

As shown in FIG. 14A, graphics processor 1410 includes a vertex processor 1405 and one or more fragment processor (s) 1415A-1415N (e.g., 1415A, 1415B, 1415C, 1415D, through 1415N-1, and 1415N). Graphics processor 1410 can execute different shader programs via separate logic, such that the vertex processor 1405 is optimized to execute operations for vertex shader programs, while the one or more fragment processor(s) 1415A-1415N execute fragment (e.g., pixel) shading operations for fragment or pixel shader programs. The vertex processor 1405 performs the vertex processing stage of the 3D graphics pipeline and generates primitives and vertex data. The fragment processor(s) 1415A-1415N use the primitive and vertex data generated by the vertex processor 1405 to produce a framebuffer that is displayed on a display device. In one embodiment, the fragment processor(s) 1415A-1415N are optimized to execute fragment shader programs as provided for in the OpenGL API, which may be used to perform similar operations as a pixel shader program as provided for in the Direct 3D API.

Graphics processor 1410 additionally includes one or more memory management units (MMUs) 1420A-1420B, cache(s) 1425A-1425B, and circuit interconnect(s) 1430A-1430B. The one or more MMU(s) 1420A-1420B provide for virtual to physical address mapping for the graphics processor 1410, including for the vertex processor 1405 and/or fragment processor(s) 1415A-1415N, which may reference vertex or image/texture data stored in memory, in addition to vertex or image/texture data stored in the one or more cache(s) 1425A-1425B. In one embodiment the one or more MMU(s) 1420A-1420B may be synchronized with other MMUs within the system, including one or more MMUs associated with the one or more application processor(s) 1205, image processor 1215, and/or video processor 1220 of FIG. 12, such that each processor 1205-1220 can participate in a shared or unified virtual memory system. The one or more circuit interconnect(s) 1430A-1430B enable graphics processor 1410 to interface with other IP cores within the SoC, either via an internal bus of the SoC or via a direct connection, according to embodiments.

As shown FIG. 14B, graphics processor 1440 includes the one or more MMU(s) 1420A-1420B, caches 1425A-1425B, and circuit interconnects 1430A-1430B of the graphics processor 1410 of FIG. 14A. Graphics processor 1440 includes one or more shader core(s) 1455A-1455N (e.g., 1455A, 1455B, 1455C, 1455D, 1455E, 1455F, through 1455N-1, and 1455N), which provides for a unified shader core architecture in which a single core or type or core can execute all types of programmable shader code, including shader program code to implement vertex shaders, fragment shaders, and/or compute shaders. The exact number of shader cores present can vary among embodiments and implementations. Additionally, graphics processor 1440 includes an inter-core task manager 1445, which acts as a thread dispatcher to dispatch execution threads to one or more shader cores 1455A-1455N and a tiling unit 1458 to accelerate tiling operations for tile-based rendering, in which rendering operations for a scene are subdivided in image space, for example to exploit local spatial coherence within a scene or to optimize use of internal caches.

Figure 15A:
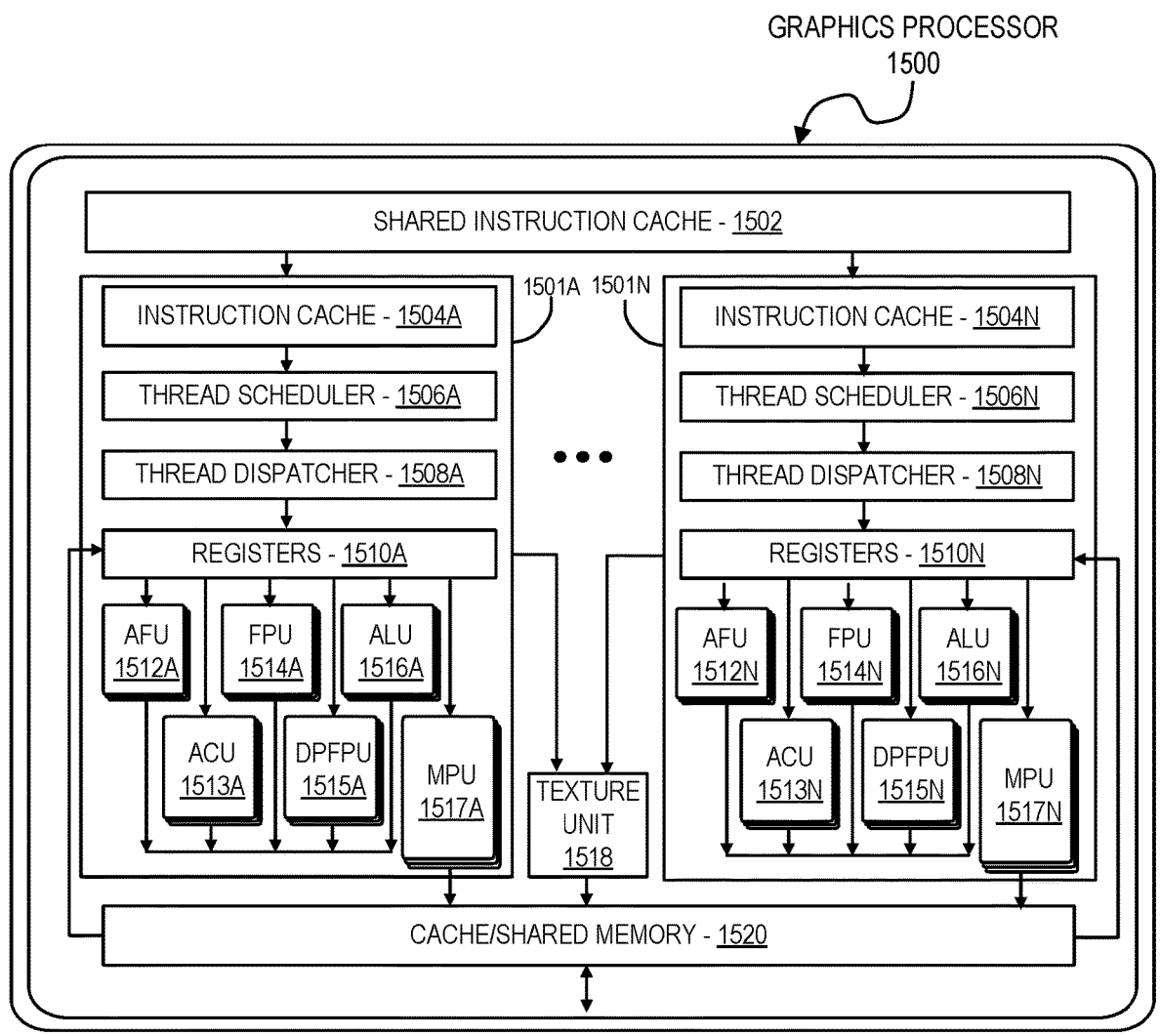
Figure 15B:
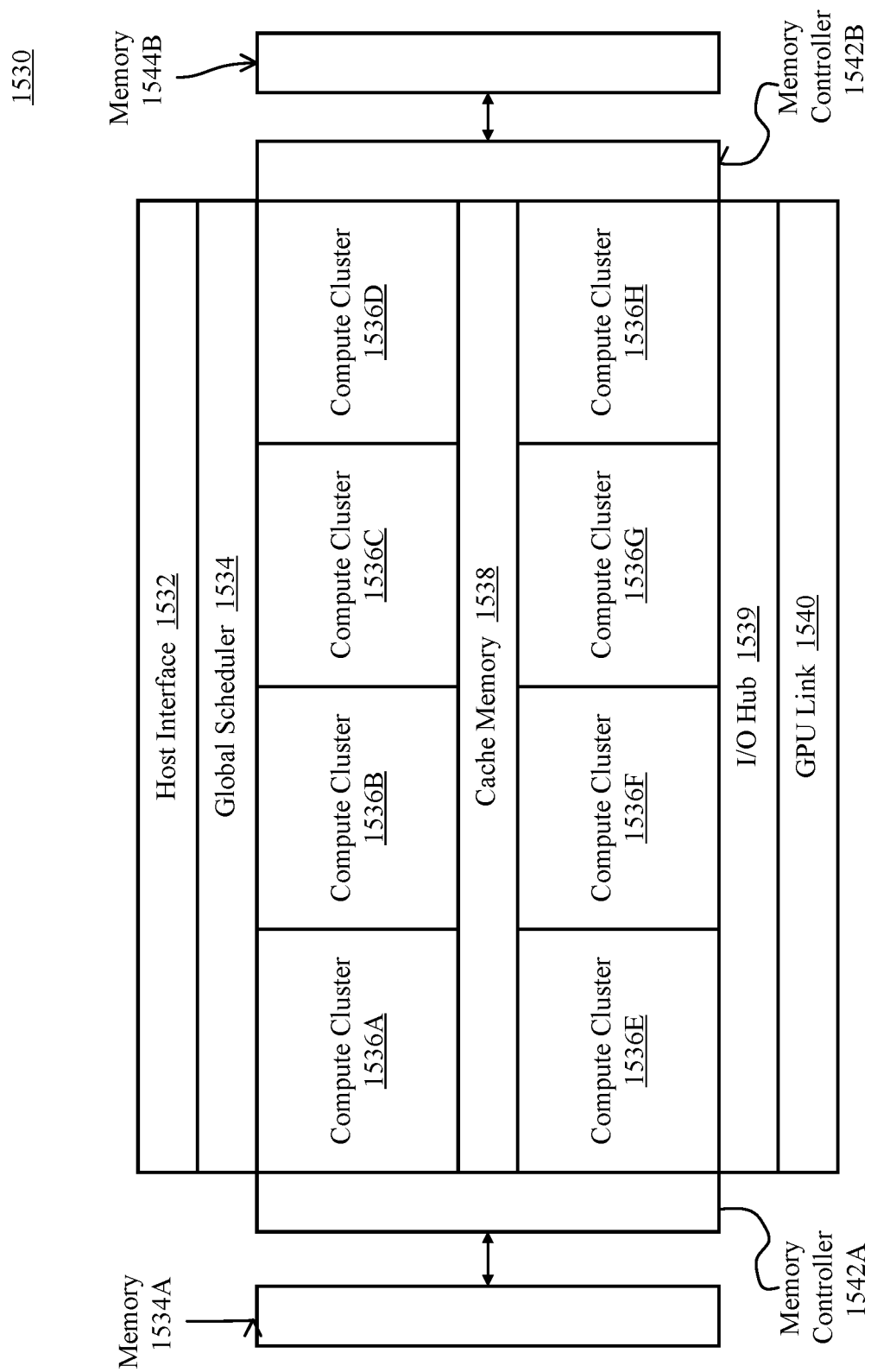

FIGS. 15A-15B illustrate additional exemplary graphics processor logic according to embodiments described herein. FIG. 15A illustrates a graphics core 1500 that may be included within the graphics processor 1210 of FIG. 12, and may be a unified shader core 1355A-1355N as in FIG. 13B. FIG. 15B illustrates a highly-parallel general-purpose graphics processing unit 1530 suitable for deployment on a multi-chip module.

As shown in FIG. 15A, the graphics core 1500 includes a shared instruction cache 1502, a texture unit 1518, and a cache/shared memory 1520 that are common to the execution resources within the graphics core 1500. The graphics core 1500 can include multiple slices 1501A-1501N or partition for each core, and a graphics processor can include multiple instances of the graphics core 1500. The slices 1501A-1501N can include support logic including a local instruction cache 1504A-1504N, a thread scheduler 1506A-1506N, a thread dispatcher 1508A-1508N, and a set of registers 1510A. To perform logic operations, the slices 1501A-1501N can include a set of additional function units (AFUs 1512A-1512N), floating-point units (FPU 1514A-1514N), integer arithmetic logic units (ALUs 1516-1516N), address computational units (ACU 1513A-1513N), double-precision floating-point units (DPFPU 1515A-1515N), and matrix processing units (MPU 1517A-1517N).

Some of the computational units operate at a specific precision. For example, the FPUs 1514A-1514N can perform single-precision (32-bit) and half-precision (16-bit) floating point operations, while the DPFPUs 1515A-1515N perform double precision (64-bit) floating point operations. The ALUs 1516A-1516N can perform variable precision integer operations at 8-bit, 16-bit, and 32-bit precision, and can be configured for mixed precision operations. The MPUs 1517A-1517N can also be configured for mixed precision matrix operations, including half-precision floating point and 8-bit integer operations. The MPUs 1517-1517N can perform a variety of matrix operations to accelerate machine learning application frameworks, including enabling support for accelerated general matrix to matrix multiplication (GEMM). The AFUs 1512A-1512N can perform additional logic operations not supported by the floating-point or integer units, including trigonometric operations (e.g., Sine, Cosine, etc.).

As shown in FIG. 15B, a general-purpose processing unit (GPGPU) 1530 can be configured to enable highly-parallel compute operations to be performed by an array of graphics processing units. Additionally, the GPGPU 1530 can be linked directly to other instances of the GPGPU to create a multi-GPU cluster to improve training speed for particularly deep neural networks. The GPGPU 1530 includes a host interface 1532 to enable a connection with a host processor. In one embodiment the host interface 1532 is a PCI Express interface. However, the host interface can also be a vendor specific communications interface or communications fabric. The GPGPU 1530 receives commands from the host processor and uses a global scheduler 1534 to distribute execution threads associated with those commands to a set of compute clusters 1536A-1536H. The compute clusters 1536A-1536H share a cache memory 1538. The cache memory 1538 can serve as a higher-level cache for cache memories within the compute clusters 1536A-1536H.

The GPGPU 1530 includes memory 1534A-1534B coupled with the compute clusters 1536A-1536H via a set of memory controllers 1542A-1542B. In various embodiments, the memory 1534A-1534B can include various types of memory devices including dynamic random access memory (DRAM) or graphics random access memory, such as synchronous graphics random access memory (SGRAM), including graphics double data rate (GDDR) memory.

In one embodiment the compute clusters 1536A-1536H each include a set of graphics cores, such as the graphics core 1500 of FIG. 15A, which can include multiple types of integer and floating point logic units that can perform computational operations at a range of precisions including suited for machine learning computations. For example and in one embodiment at least a subset of the floating point units in each of the compute clusters 1536A-1536H can be configured to perform 16-bit or 32-bit floating point operations, while a different subset of the floating point units can be configured to perform 64-bit floating point operations.

Multiple instances of the GPGPU 1530 can be configured to operate as a compute cluster. The communication mechanism used by the compute cluster for synchronization and data exchange varies across embodiments. In one embodiment the multiple instances of the GPGPU 1530 communicate over the host interface 1532. In one embodiment the GPGPU 1530 includes an I/O hub 1539 that couples the GPGPU 1530 with a GPU link 1540 that enables a direct connection to other instances of the GPGPU. In one embodiment the GPU link 1540 is coupled to a dedicated GPU-to-GPU bridge that enables communication and synchronization between multiple instances of the GPGPU 1530. In one embodiment the GPU link 1540 couples with a high speed interconnect to transmit and receive data to other GPGPUs or parallel processors. In one embodiment the multiple instances of the GPGPU 1530 are located in separate data processing systems and communicate via a network device that is accessible via the host interface 1532. In one embodiment the GPU link 1540 can be configured to enable a connection to a host processor in addition to or as an alternative to the host interface 1532.

While the illustrated configuration of the GPGPU 1530 can be configured to train neural networks, one embodiment provides alternate configuration of the GPGPU 1530 that can be configured for deployment within a high performance or low power inferencing platform. In an inferencing configuration the GPGPU 1530 includes fewer of the compute clusters 1536A-1536H relative to the training configuration. Additionally, the memory technology associated with the memory 1534A-1534B may differ between inferencing and training configurations, with higher bandwidth memory technologies devoted to training configurations. In one embodiment the inferencing configuration of the GPGPU 1530 can support inferencing specific instructions. For example, an inferencing configuration can provide support for one or more 8-bit integer dot product instructions, which are commonly used during inferencing operations for deployed neural networks.

Quantum State Imaging for Memory Optimization

Classical computing has benefitted from 50+ years of technology advancement to aid in the design and development of new computing architectures. Simulation tools have been critical to the rapid development of modern classical computing designs. Such simulation tools are used for the design, benchmarking, and performance analysis of the new architectures along critical metrics. Along with the advancement of Moore's Law at the device and transistor layer, similar advances in algorithms and hardware technologies have pushed the frontier of classical computing ever forward.

Full simulation of the operations of a quantum computing processor requires a prohibitively large amount of high performance classical compute (HPC) resources both to store the processor state in memory and to compute the evolution of the qubit register state at each simulation time step. For a quantum computer with a qubit register size of 500 qubits, approximately $2^{500}$ 64-bit floating point doubles need to be stored at each time step of the simulation. This memory storage size requirement is larger than the estimated number of atoms in the Universe. Embodiments described herein reduce the amount of HPC resources required to simulate the operation of a quantum computer both from a memory size perspective as well as a computational perspective.

State of the art quantum computer simulation platforms are limited to <100 qubits for simulation of a quantum processor. The current state of the art quantum simulators rely on supercomputers with thousands of compute nodes networked in a cluster to assemble a huge amount of memory in ranges from hundreds of Terabytes to Petabytes. Examples of these simulators are Intel-QS with 45 qubits requiring 0.192 Petabytes of HPC memory. Others have produced simulations of quantum circuits having 49 as well as 56 qubits, however, such simulators break down the system to smaller subsystems and do not calculate the state of all of the qubits altogether at the same time. In order to reduce the amount of required memory, graphical models such as tensor networks and binary decision diagrams (BDD) and multiple-value decision diagrams (MVDD), and have been introduced with some limited reduction in the HPC resources required.

All these previous quantum simulators do not address mixed states calculations. In other words, they can simulate the pure states of the quantum system but are extremely inefficient when algorithms utilize entangled (mixed) states. Each simulator listed above is memory size and memory bandwidth limited. Tensor network and BDD based solutions focus on compact representation of state of the system and quantum operations in order to reduce the amount of memory required, but they don't offer an efficient way of tracking the relationship between quantum registers in order to further reduce and optimize the computational space. Tensor representations are also computationally more expensive than the quantum state imaging embodiments described herein. However, embodiments can also leverage those graphical or decision diagram-based methods and be integrated with them to further improve performance and reduce memory consumption for a full quantum processor simulator.

Embodiments model the state of a quantum system at a given time as a graphical image such that each quantum register in the system is associated with the content of one or multiple pixels in the image. The probability of the qubit being in a particular state is represented as the color or color intensity of the associated pixels. This image is referred to as a quantum state image. The encoded qubit values represented by the image pixels can be used to reduce the amount of memory needed to store a quantum states, and to also enable the use of graphics processing pipeline technologies to calculate the next time step evolution of these states.

Embodiments can be used to significantly shorten the design cycle for quantum processor designs. By reducing the costs to explore the design space through reductions in the amount of HPC resources required such as number of physical nodes, memory bandwidth and latency, supercomputing time leasing as well as the enhanced computational efficiency of using GPUs or Xeon Phi massively parallel MIC resources, the beat rate of processor designs can be increased. Additionally, embodiments are able to simulate many more qubits and their correlations than current state of the art simulators in the market.

Figure 16:
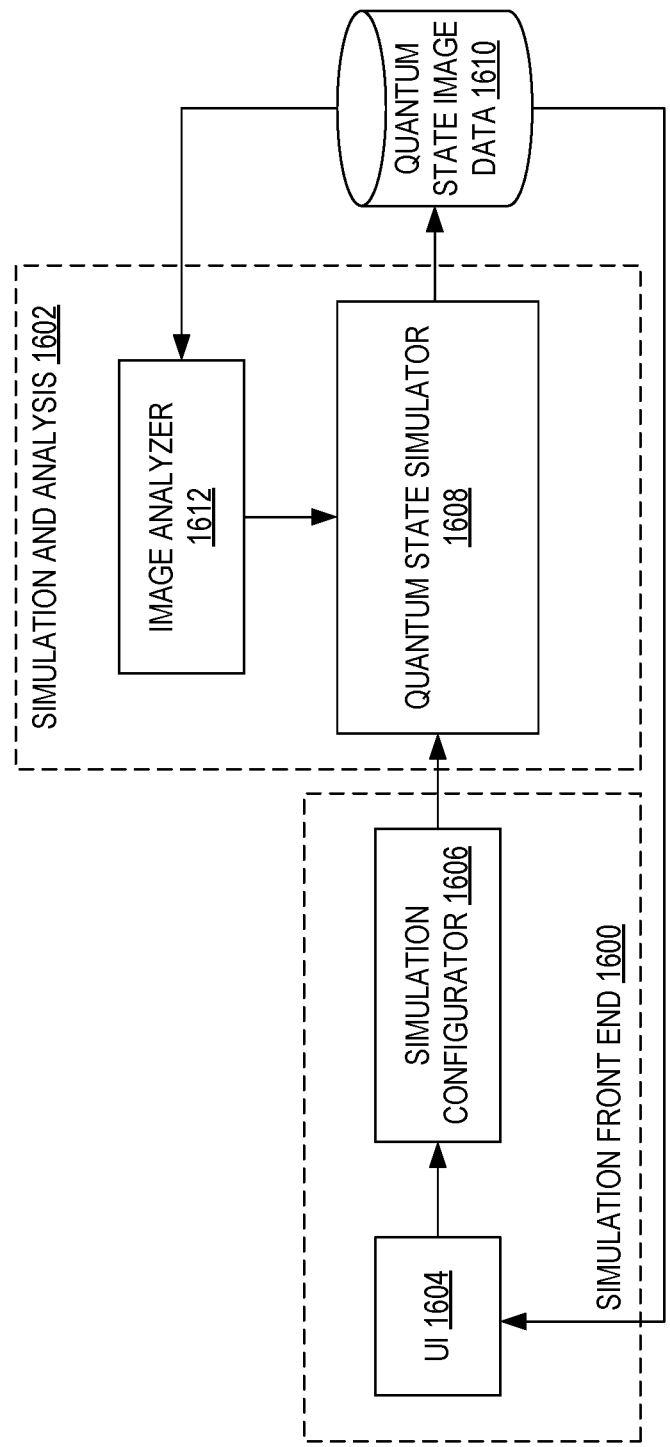
FIG. 16 illustrates an exemplary quantum state simulator in accordance with an embodiment.

FIG. 16 illustrates an exemplary quantum state simulation system in accordance with an embodiment. As shown in FIG. 16, the quantum state simulation system may include a simulation front end 1600 and a simulation and analysis module 1602. The simulation front end may include a user interface (UI) 1604 (e.g., a graphical user interface) and a simulation configurator 1606. Simulation configurator 1606 may receive an initial quantum state of a quantum system and map the initial quantum state to an image file. For example, the initial quantum state may be represented as a Quantum Information Decision Diagram (QuIDD) data structure, BDD, MVDD, tensor representation, or other representation of the quantum state which may be evolved without decompressing the representation.

A quantum computer processor may include one or more quantum registers that include quantum bits (qubits) that represent the state of the quantum computer at each step of a computation. In order to simulate the quantum processor on a classical computer, one must keep track of at least two complex double numbers per qubit in the register with each complex double representing the state of that qubit. This means that there are 2N complex double numbers for the entire quantum register state comprised of N qubits. On a modern classical processor, each complex double number is stored as 8 bytes of memory meaning that a single qubit state requires 16 bytes of memory to be stored at each time step of the simulation. For a qubit register size of say 32 qubits (N=32) would require 64 Gigabytes of RAM for a single snapshot of the quantum register state.

As described above, the quantum state space can require a prohibitive amount of HPC resources to simulate more than a few dozen qubits. As such, embodiments compress the state space complex double amplitudes down to something more efficient, enabling simulations of 100s of qubits. The complex doubles that represent the state of each qubit can be encoded using techniques, such as QuIDD, BDD, Multi-variable decision diagrams, or other techniques, in a compressed form that allows calculations to be performed for the next time step without decompressing the encoded representations back to the full state vector. For example, in a QuIDD representation, the full state vector may be represented as a graph, with each complex double in the terminal nodes of the graph reused when storing the full state vector and each edge in the graph maps the complex double to the appropriate qubit state. This achieves some degree of compression while maintaining the relationship of state to qubit.

The resulting encoded representation (e.g., the complex doubles) can then be encoded in a graphical image format such as a bitmap, pixmap, JPG, BMP, PNG, etc. This allows for further data compression and more efficient storage of each snapshot.

Once the initial quantum state has been mapped to an initial quantum state image file, the initial quantum state image file can be passed to quantum state simulation and analysis module 1602. Quantum state simulation and analysis module 1602 may include a quantum state simulator 1608 and an image analyzer 1612. Quantum state simulator 1608 can use 3D accelerated image manipulation routines to perform the complex matrix multiplications needed to evolve the qubit register state for each time step. Quantum state simulator 1608 can output time-dependent snapshots which may be stored in quantum state image data store 1610.

In some embodiments, image analyzer 1612 can find and track the relationship or correlation between quantum registers during the quantum circuit evolution, utilizing image processing techniques and/or motion detection/machine vision algorithms such as background/foreground subtraction, feature extraction, classification, etc. Detecting the relationship or correlation between quantum registers enables the system to be divided into smaller subsystems efficiently, which reduces the computational complexity and increases performance. In some embodiments, the analyzed images, including indications of the relationship or correlation between quantum registers may then be provided to the user through UI 1604. In some embodiments, each quantum state image may be viewed through UI 1604 without additional analysis.

In some embodiments, to evolve the qubit register to a new state, there is a time dependent quantum mechanical equation that determines the outcome based on the quantum gate that is being applied at each time step. This equation is specific to the physical implementation of the qubits on a hardware device and differs for each technology that is used to implement the quantum processor at that level. For example, the Hamiltonian describing the state evolution of a superconducting Transmon qubit quantum state register is based on the cavity quantum electrical dynamics equation known as the Jaynes-Cummings Hubbard Model for photon cavities. For quantum dot qubits, the Hamiltonian equation that determines the next state of the quantum register is based on a modified Nuclear Magnetic Resonance dynamics equation that takes into account the charge potentials of the individual electrons comprising the qubits.

Although illustrated as separate entities, the simulation front end 1600 and quantum state simulation and analysis module 1602 may be implemented on the same computing platform (e.g., the same workstation or server) or may be distributed across multiple different computing platforms. For example, in some embodiments, the simulation and analysis module 1602 may be implemented using one or more graphics processors, using shaders to implement quantum state simulator 1608 and image analyzer 1612.

Figure 17:
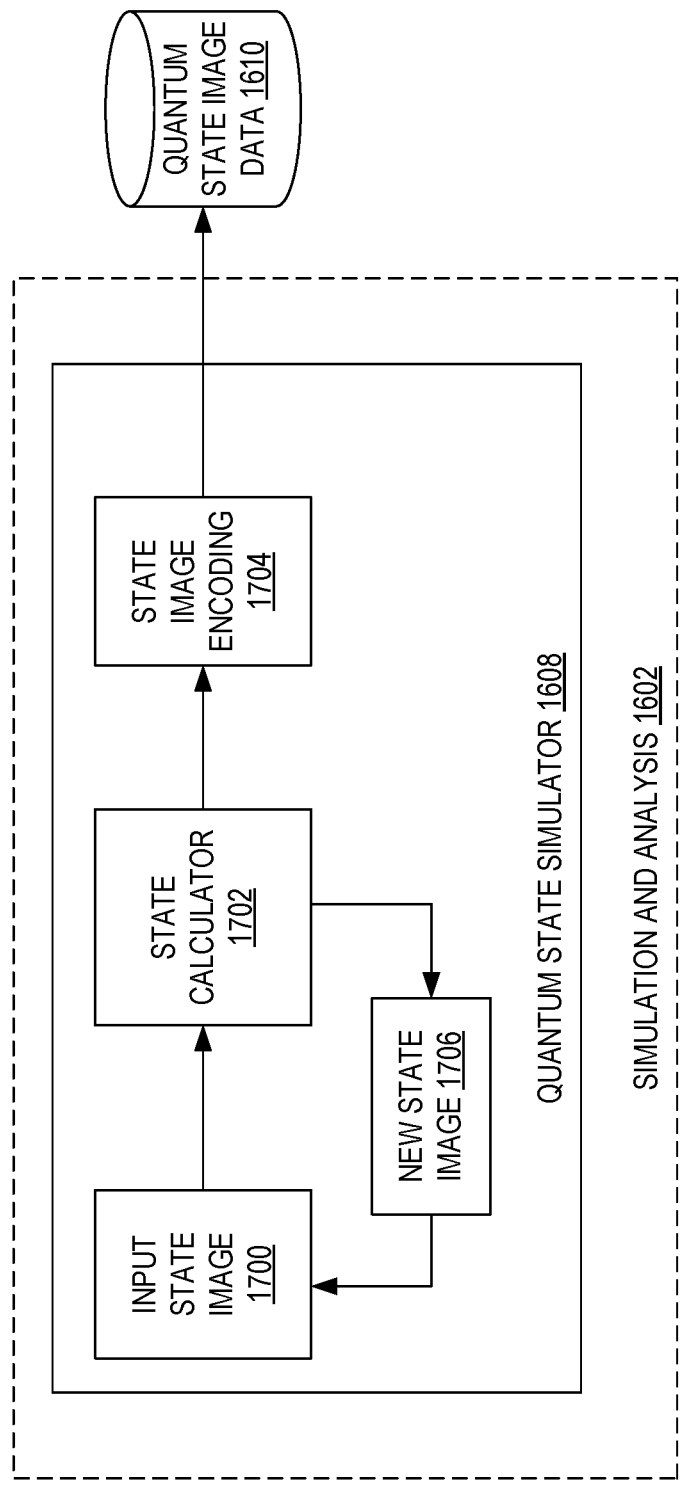
FIG. 17 illustrates additional details for an embodiment of the quantum state simulator.

FIG. 17 illustrates additional details for an embodiment of the quantum state simulator. As shown in FIG. 17, quantum state simulator 1608 can receive an input quantum state image 1700. The input quantum state image, as described above, may be a graphical representation of the quantum state of a quantum processor at a first time. A state calculator 1702 can receive the input quantum state image and then solve Schrödinger's equation using a graphics matrix-vector pipeline and output a modification or update to the state representation encoded in the image. In some embodiments, a graphics accelerator API or SDK may be used to operate on compressed data in image format in the simulation using existing image compression and image processing libraries, and an updated quantum state image snapshot can be generated.

State image encoding module 1704 can receive the new quantum state image snapshot and encode the new snapshot using MPEG, MPV, H.264 or other encoding techniques. In some embodiments, additional compression, as used in image and video compression, such as sum of differences, can be used to further compress the state images through time. The state image encoding module 1704 can then store the new state image to quantum state image data store 1610. The new state image 1706 may be used as a new input image to the state calculator 1702 to evolve the state of the quantum to later times, with the process continuing in a loop until the simulation has ended or is terminated.

In some embodiments, the application of the QuIDD, BDD, MVDD or other representation and encoding to standard image format and compression reduces the amount of HPC resources required while retaining the ability to perform rapid calculations on these state variables through standard High Level Shader Language routines in existing graphics accelerators. Further compression of the full quantum system evolution through time can be achieved by further encoding in a video stream format that only stores the differences in image cell tiles between snapshots rather than the full snapshot for each time step.

To simulate the quantum processor operation, the evolution of the quantum register can be calculated. To capture the state of the quantum system at different times, there is a time-dependent equation that needs to be solved. Embodiments enable snapshots (images) of the quantum states at various times to be calculated, and stores the calculated values for each quantum register at each time step in the associated pixels of the image/images. These values can be stored as a color or color intensity in each pixel. In some embodiments, binary/multiple-valued decision diagram methods may be used to map quantum states to images. Then a relationship or correlation of pixels in the image can be identified to detect dependency between quantum registers. These dependencies may be used to divide the quantum system to smaller subsystems and calculate the evolution of independent subsystems separately.

For a quantum system of N number of qubits, the conventional calculation requires storing continuously 2N complex double numbers (each complex double number requires 16 bytes memory). Embodiments allow storing only N number of pixels which each include double numbers (each double number requires 8 bytes memory). As a result, embodiments produce a set of individual pictures, like those produced from time-lapse photography, of a system that is difficult to capture, like a hummingbird flying.

Figure 18:
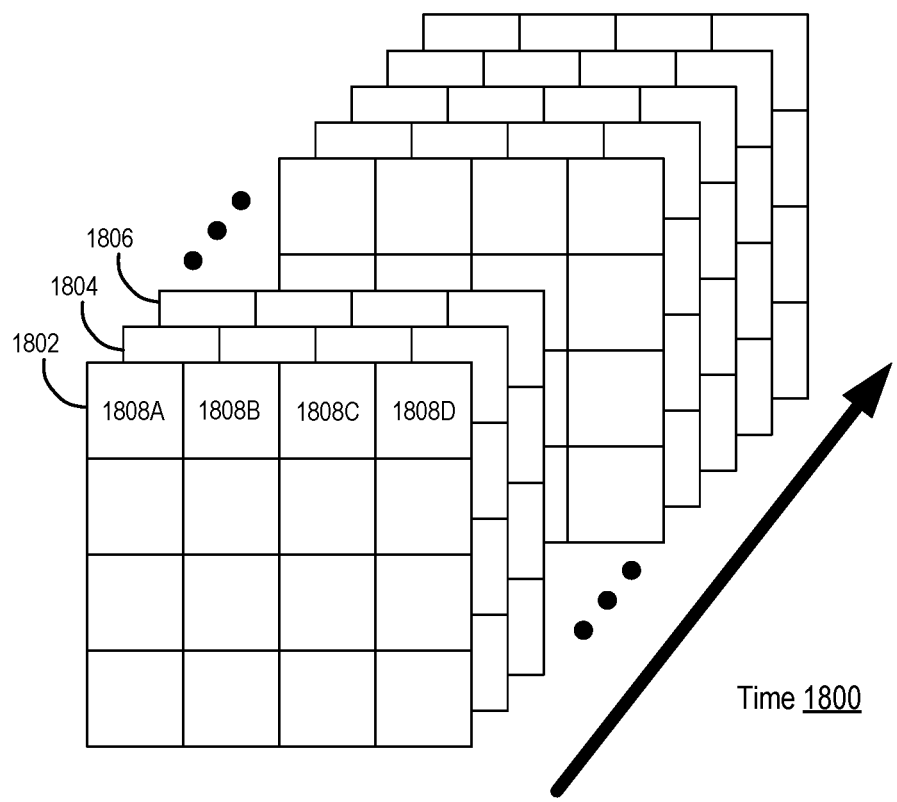
FIG. 18 illustrates snapshots of quantum state images, in accordance with an embodiment.

FIG. 18 illustrates snapshots of quantum state images, in accordance with an embodiment. As shown in FIG. 18, a series of quantum state images, each at a different time 1800 can be produced by the simulator 1608. Each image 1802, 1804, 1806 may include a plurality of pixels 1808A-1808D each representing a different qubit. For example, FIG. 18 illustrates quantum state image snapshots that each represent 16 qubits. During the evolution of the quantum system, the image representation of the quantum state is captured in various times 1800. As discussed, the snapshots may be encoded using video encoding techniques to provide additional compression and/or analysis of the encoded quantum state information.

Figure 19:
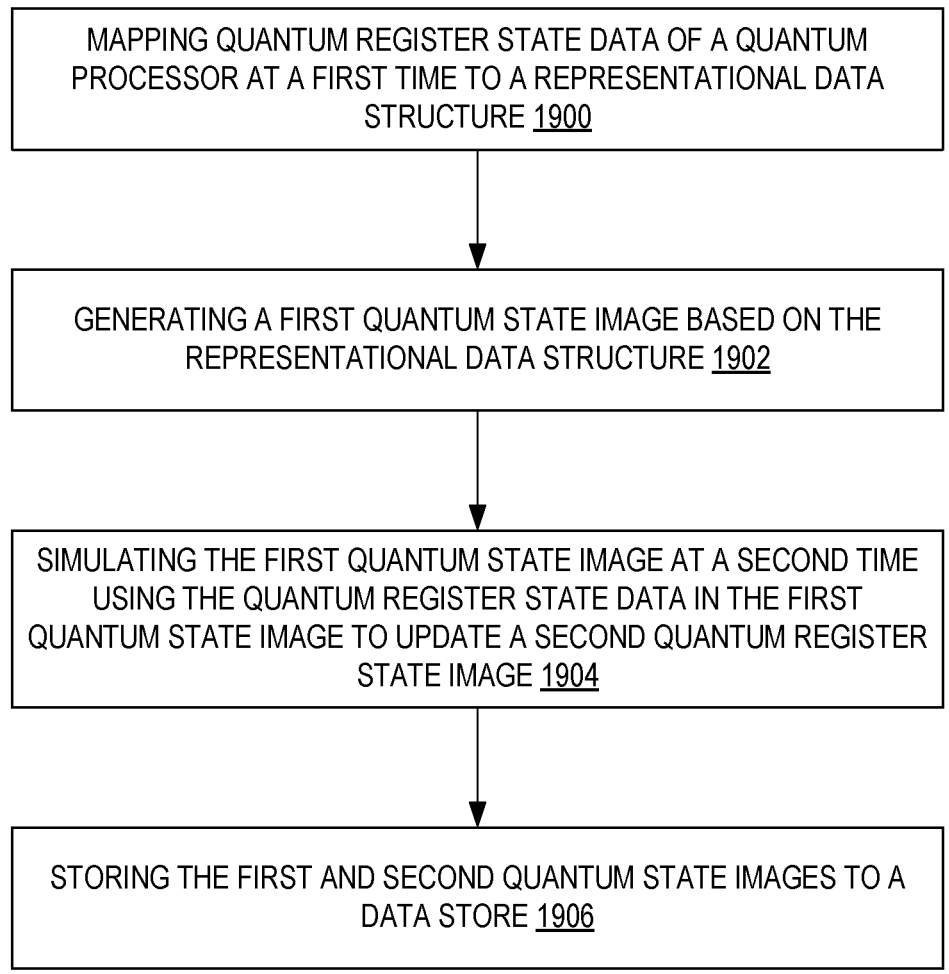
FIG. 19 illustrates a block diagram of a method of quantum state simulation, in accordance with an embodiment.

FIG. 19 illustrates a block diagram of a process of quantum state simulation, in accordance with an embodiment. The process may be implemented within the context of the system architectures described above, but is not limited to any particular quantum system architecture.

At 1900, quantum register state data of a quantum processor at a first time can be mapped to a representational data structure. At 1902, a first quantum state image can be generated based on the representational data structure. In some embodiments, generating a first quantum state image based on the representational data structure, can further comprise storing values for the quantum register state data at the first time period in corresponding pixels of the first quantum state image. In some embodiments, the values for the quantum register are determined from the representational data structure and wherein the values for the quantum register are stored as a color or color intensity in the corresponding pixels. In some embodiments, each value for the quantum register indicates a probability of a qubit being in a particular state.

At 1904, the first quantum state image can be simulated at a second time using the quantum register state data in the first quantum state image to update a second quantum register state image. At 1906, the first and second quantum state images can be stored to a data store.

In some embodiments, the first quantum state image and the second quantum state image can be encoded using a video encoder. In some embodiments, a plurality of quantum state images can be analyzed to identify a correlation between quantum registers over time, and the quantum processor can be divided into a plurality of subsystems based on the correlation. In some embodiments, the representational data structure includes one of Quantum Information Decision Diagram (QuIDD) data structure, binary decision diagram (BDD) data structure, multiple-value decision diagrams (MVDD) data structure, or tensor representation.

EXAMPLES

The following are example implementations of different embodiments of the invention.

Example 1

A method comprising: mapping quantum register state data of a quantum processor at a first time to a representational data structure; generating a first quantum state image based on the representational data structure; simulating the first quantum state image at a second time using the quantum register state data in the first quantum state image to update a second quantum register state image; and storing the first and second quantum state images to a data store.

Example 2

The method of claim 1 wherein generating a first quantum state image based on the representational data structure, further comprises: storing values for the quantum register state data at the first time period in corresponding pixels of the first quantum state image.

Example 3

The method of claim 2 wherein the values for the quantum register are determined from the representational data structure and wherein the values for the quantum register are stored as a color or color intensity in the corresponding pixels.

Example 4

The method of claim 3 wherein each value for the quantum register indicates a probability of a qubit being in a particular state.

Example 5

The method of claim 1, further comprising: encoding the first quantum state image and the second quantum state image using a video encoder.

Example 6

The method of claim 1, further comprising: analyzing a plurality of quantum state images to identify a correlation between quantum registers over time; and dividing the quantum processor into a plurality of subsystems based on the correlation.

Example 7

The method of claim 1 wherein the representational data structure includes one of Quantum Information Decision Diagram (QuIDD) data structure, binary decision diagram (BDD) data structure, multiple-value decision diagrams (MVDD) data structure, or tensor representation.

Example 8

A non-transitory machine-readable medium having program code stored thereon which, when executed by a machine, causes the machine to perform the operations of: mapping quantum register state data of a quantum processor at a first time to a representational data structure; generating a first quantum state image based on the representational data structure; simulating the first quantum state image at a second time using the quantum register state data in the first quantum state image to update a second quantum register state image; and storing the first and second quantum state images to a data store.

Example 9

The non-transitory machine-readable medium of claim 8 wherein generating a first quantum state image based on the representational data structure, further comprises: storing values for the quantum register state data at the first time period in corresponding pixels of the first quantum state image.

Example 10

The non-transitory machine-readable medium of claim 9 wherein the values for the quantum register are determined from the representational data structure and wherein the values for the quantum register are stored as a color or color intensity in the corresponding pixels.

Example 11

The non-transitory machine-readable medium of claim 10 wherein each value for the quantum register indicates a probability of a qubit being in a particular state.

Example 12

The non-transitory machine-readable medium of claim 8, wherein the program code, when executed by a machine, further causes the machine to perform the operations of: encoding the first quantum state image and the second quantum state image using a video encoder.

Example 13

The non-transitory machine-readable medium of claim 8, wherein the program code, when executed by a machine, further causes the machine to perform the operations of: analyzing a plurality of quantum state images to identify a correlation between quantum registers over time; and dividing the quantum processor into a plurality of subsystems based on the correlation.

Example 14

The non-transitory machine-readable medium of claim 8 wherein the representational data structure includes one of Quantum Information Decision Diagram (QuIDD) data structure, binary decision diagram (BDD) data structure, multiple-value decision diagrams (MVDD) data structure, or tensor representation.

Example 15

A system comprising: a graphics processing device; a simulation configurator to: map quantum register state data of a quantum processor at a first time to a representational data structure; and to generate a first quantum state image based on the representational data structure; a quantum state simulator to: simulate, using the graphics processing device, the first quantum state image at a second time using the quantum register state data in the first quantum state image to update a second quantum register state image; and store the first and second quantum state images to a data store.

Example 16

The system of claim 15 wherein generate a first quantum state image based on the representational data structure, the simulation configurator is further to: store values for the quantum register state data at the first time period in corresponding pixels of the first quantum state image.

Example 17

The system of claim 16 wherein the values for the quantum register are determined from the representational data structure and wherein the values for the quantum register are stored as a color or color intensity in the corresponding pixels.

Example 18

The system of claim 17 wherein each value for the quantum register indicates a probability of a qubit being in a particular state.

Example 19

The system of claim 15, wherein the quantum state simulator is further to: encode the first quantum state image and the second quantum state image using a video encoder.

Example 20

The system of claim 15, wherein the quantum state simulator is further to: analyze a plurality of quantum state images to identify a correlation between quantum registers over time; and divide the quantum processor into a plurality of subsystems based on the correlation.

In the above detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments. Terms like "first," "second," "third," etc. do not imply a particular ordering, unless otherwise specified.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous.

Embodiments of the invention may include various steps, which have been described above. The steps may be embodied in machine-executable instructions which may be used to cause a general-purpose or special-purpose processor to perform the steps. Alternatively, these steps may be performed by specific hardware components that contain hard-wired logic for performing the steps, or by any combination of programmed computer components and custom hardware components.

As described herein, instructions may refer to specific configurations of hardware such as application specific integrated circuits (ASICs) configured to perform certain operations or having a predetermined functionality or software instructions stored in memory embodied in a non-transitory computer readable medium. Thus, the techniques shown in the figures can be implemented using code and data stored and executed on one or more electronic devices (e.g., an end station, a network element, etc.). Such electronic devices store and communicate (internally and/or with other electronic devices over a network) code and data using computer machine-readable media, such as non-transitory computer machine-readable storage media (e.g., magnetic disks; optical disks; random access memory; read only memory; flash memory devices; phase-change memory) and transitory computer machine-readable communication media (e.g., electrical, optical, acoustical or other form of propagated signals—such as carrier waves, infrared signals, digital signals, etc.).

In addition, such electronic devices typically include a set of one or more processors coupled to one or more other components, such as one or more storage devices (non-transitory machine-readable storage media), user input/output devices (e.g., a keyboard, a touchscreen, and/or a display), and network connections. The coupling of the set of processors and other components is typically through one or more busses and bridges (also termed as bus controllers). The storage device and signals carrying the network traffic respectively represent one or more machine-readable storage media and machine-readable communication media. Thus, the storage device of a given electronic device typically stores code and/or data for execution on the set of one or more processors of that electronic device. Of course, one or more parts of an embodiment of the invention may be implemented using different combinations of software, firmware, and/or hardware. Throughout this detailed description, for the purposes of explanation, numerous specific details were set forth in order to provide a thorough understanding of the present invention. It will be apparent, however, to one skilled in the art that the invention may be practiced without some of these specific details. In certain instances, well known structures and functions were not described in elaborate detail in order to avoid obscuring the subject matter of the present invention. Accordingly, the scope and spirit of the invention should be judged in terms of the claims which follow.

What is claimed is:

1. A method comprising:
    mapping quantum register state data of a quantum processor at a first time to a representational data structure;
    generating a first quantum state image based on the representational data structure, the first quantum state image including pixels each representing one or more encoded quantum bit values of the quantum processor, each quantum bit value indicating a probability of a quantum bit being in a particular state;
    simulating, using a graphics processing device, the first quantum state image at a second time using the quantum register state data in the first quantum state image to update a second quantum register state image; and
    storing the first and second quantum state images to a data store.

2. The method of claim 1 wherein generating the first quantum state image based on the representational data structure further comprises:
    storing values for the quantum register state data at the first time in corresponding pixels of the first quantum state image.

3. The method of claim 2 wherein the values for the quantum register are determined from the representational data structure and wherein the values for the quantum register are stored as a color or color intensity in the corresponding pixels.

4. The method of claim 1, further comprising:
    encoding the first quantum state image and the second quantum state image using a video encoder.

5. The method of claim 1, further comprising:
    analyzing a plurality of quantum state images to identify a correlation between quantum registers over time; and
    dividing the quantum processor into a plurality of subsystems based on the correlation.

6. The method of claim 1 wherein the representational data structure includes one of Quantum Information Decision Diagram (QuIDD) data structure, binary decision diagram (BDD) data structure, multiple-value decision diagrams (MVDD) data structure, or tensor representation.

7. A non-transitory machine-readable medium having program code stored thereon which, when executed by a machine, causes the machine to perform the operations of:
    mapping quantum register state data of a quantum processor at a first time to a representational data structure;

generating a first quantum state image based on the representational data structure, the first quantum state image including pixels each representing one or more encoded quantum bit values of the quantum processor, each quantum bit value indicating a probability of a quantum bit being in a particular state;

simulating, using a graphics processing device, the first quantum state image at a second time using the quantum register state data in the first quantum state image to update a second quantum register state image; and storing the first and second quantum state images to a data store.

8. The non-transitory machine-readable medium of claim 7 wherein generating the first quantum state image based on the representational data structure; further comprises:

storing values for the quantum register state data at the first time in corresponding pixels of the first quantum state image.

9. The non-transitory machine-readable medium of claim 8 wherein the values for the quantum register are determined from the representational data structure and wherein the values for the quantum register are stored as a color or color intensity in the corresponding pixels.

10. The non-transitory machine-readable medium of claim 7, wherein the program code, when executed by a machine, further causes the machine to perform the operations of:

encoding the first quantum state image and the second quantum state image using a video encoder.

11. The non-transitory machine-readable medium of claim 7, wherein the program code, when executed by a machine, further causes the machine to perform the operations of:

analyzing a plurality of quantum state images to identify a correlation between quantum registers over time; and dividing the quantum processor into a plurality of subsystems based on the correlation.

12. The non-transitory machine-readable medium of claim 7 wherein the representational data structure includes one of Quantum Information Decision Diagram (QuIDD) data structure, binary decision diagram (BDD) data structure, multiple-value decision diagrams (MVDD) data structure, or tensor representation.

13. A system comprising:

a graphics processing device;

a simulation configurator to:
map quantum register state data of a quantum processor at a first time to a representational data structure; and
generate a first quantum state image based on the representational data structure, the first quantum state image including pixels each representing one or more encoded quantum bit values of the quantum processor, each quantum bit value indicating a probability of a quantum bit being in a particular state;

a quantum state simulator to:
simulate, using the graphics processing device, the first quantum state image at a second time using the quantum register state data in the first quantum state image to update a second quantum register state image; and
store the first and second quantum state images to a data store.

14. The system of claim 13 wherein to generate the first quantum state image based on the representational data structure, the simulation configurator is further to:
store values for the quantum register state data at the first time in corresponding pixels of the first quantum state image.

15. The system of claim 14 wherein the values for the quantum register are determined from the representational data structure and wherein the values for the quantum register are stored as a color or color intensity in the corresponding pixels.

16. The system of claim 13, wherein the quantum state simulator is further to:
encode the first quantum state image and the second quantum state image using a video encoder.

17. The system of claim 13, wherein the quantum state simulator is further to:
analyze a plurality of quantum state images to identify a correlation between quantum registers over time; and
divide the quantum processor into a plurality of subsystems based on the correlation.

* * * * *